(12) United States Patent
Yamamoto et al.

(10) Patent No.: US 8,582,708 B2
(45) Date of Patent: Nov. 12, 2013

(54) CLOCK AND DATA RECOVERY CIRCUIT

(75) Inventors: Michiyo Yamamoto, Osaka (JP); Kenji Murata, Osaka (JP); Kazuya Hatooka, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/344,201

(22) Filed: Jan. 5, 2012

(65) Prior Publication Data

US 2012/0105115 A1     May 3, 2012

Related U.S. Application Data

(63) Continuation of application No. PCT/JP2010/004392, filed on Jul. 5, 2010.

(30) Foreign Application Priority Data

Jul. 6, 2009 (JP) .................................. 2009-159855

(51) Int. Cl.
     *H04L 7/00*             (2006.01)
(52) U.S. Cl.
     USPC ........... 375/355; 375/360; 375/354; 375/371; 375/373; 375/376; 375/375
(58) Field of Classification Search
     USPC .......... 375/355, 360, 354, 371, 373, 376, 375
     See application file for complete search history.

(56) References Cited

U.S. PATENT DOCUMENTS

| | | | |
|---|---|---|---|
| 5,003,562 A * | 3/1991 | van Driest et al. | 375/327 |
| 5,642,386 A * | 6/1997 | Rocco, Jr. | 375/355 |
| 5,909,473 A * | 6/1999 | Aoki et al. | 375/373 |
| 6,278,755 B1 * | 8/2001 | Baba et al. | 375/360 |
| 6,556,640 B1 * | 4/2003 | Baba | 375/376 |
| 6,567,484 B1 | 5/2003 | Hirota et al. | |
| 6,603,299 B1 * | 8/2003 | Hudson et al. | 324/76.53 |
| 6,850,580 B1 * | 2/2005 | Naoe | 375/355 |
| 6,970,890 B1 * | 11/2005 | Bruce et al. | 1/1 |
| 8,023,605 B2 * | 9/2011 | Tsukamoto et al. | 375/355 |

(Continued)

FOREIGN PATENT DOCUMENTS

| | | |
|---|---|---|
| JP | 9-233061 | 9/1997 |
| JP | 2004-128980 | 4/2004 |

(Continued)

OTHER PUBLICATIONS

International Search Report, with English Translation, issued in International Patent Application No. PCT/JP2010/004392, mailed Sep. 28, 2010.

*Primary Examiner* — Kenneth Lam
(74) *Attorney, Agent, or Firm* — McDermott Will & Emery LLP

(57) ABSTRACT

A clock and data recovery circuit includes a multiphase clock generator circuit which generates a multiphase clock having a plurality of clocks, a sampling circuit which samples a received data signal transferring serial data in synchronism with each of the plurality of clocks, and generates a plurality of data signals, a data recovery unit which generates a selection signal indicating a data signal having an appropriate phase among the plurality of data signals, and a storage unit which stores the selection signal. The data recovery unit selects one of the plurality of data signals, based on the selection signal read from the storage unit, and a clock corresponding to the selected data signal.

16 Claims, 19 Drawing Sheets

(56) References Cited

U.S. PATENT DOCUMENTS

| | | |
|---|---|---|
| 2004/0252804 A1 | 12/2004 | Aoyama |
| 2004/0258410 A1* | 12/2004 | Yajima et al. .................. 398/71 |
| 2006/0109942 A1* | 5/2006 | Vallet ............................ 375/355 |
| 2006/0119402 A1* | 6/2006 | Thomsen et al. .............. 327/105 |
| 2006/0227916 A1* | 10/2006 | Masui et al. ................... 375/355 |
| 2006/0256909 A1* | 11/2006 | On et al. ....................... 375/376 |
| 2007/0160173 A1* | 7/2007 | Takeuchi ....................... 375/355 |
| 2008/0056420 A1* | 3/2008 | Tsukamoto et al. ........... 375/355 |
| 2010/0172457 A1* | 7/2010 | Den Besten et al. .......... 375/376 |

FOREIGN PATENT DOCUMENTS

| | | |
|---|---|---|
| JP | 2005-005999 | 1/2005 |
| JP | 2006-262165 | 9/2006 |
| JP | 2007-184847 | 7/2007 |
| JP | 2008-017250 | 1/2008 |

* cited by examiner

| DEC[1] | DEC[0] | OUTPUT OF LOGIC CIRCUIT |
|---|---|---|
| UP | UP | UP-SHIFT |
| UP | HOLD | UP-SHIFT |
| HOLD | UP | UP-SHIFT |
| HOLD | HOLD | HOLD |
| UP | DOWN | HOLD |
| DOWN | UP | HOLD |
| DOWN | HOLD | DOWN-SHIFT |
| HOLD | DOWN | DOWN-SHIFT |
| DOWN | DOWN | DOWN-SHIFT |

FIG.19A

| DATA SIGNAL | D11 | D10 | D9 | D8 | D7 | D6 | D5 | D4 | D3 | D2 | D1 | D0 |
|---|---|---|---|---|---|---|---|---|---|---|---|---|
| SELECTION FREQUENCY | 0 | 0 | 3 | 4 | 5 | 4 | 3 | 0 | 0 | 0 | 0 | 0 |
| | NOT NEEDED | | NEEDED | | | | | NOT NEEDED | | | | |

FIG.19B

| DATA SIGNAL | D11 | D10 | D9 | D8 | D7 | D6 | D5 | D4 | D3 | D2 | D1 | D0 |
|---|---|---|---|---|---|---|---|---|---|---|---|---|
| SELECTION FREQUENCY | 0 | 2 | | 9 | | 8 | | 2 | | | | |
| | NOT NEEDED | NEEDED | NOT NEEDED | NEEDED | NOT NEEDED | NEEDED | NOT NEEDED | NEEDED | NOT NEEDED | | | |

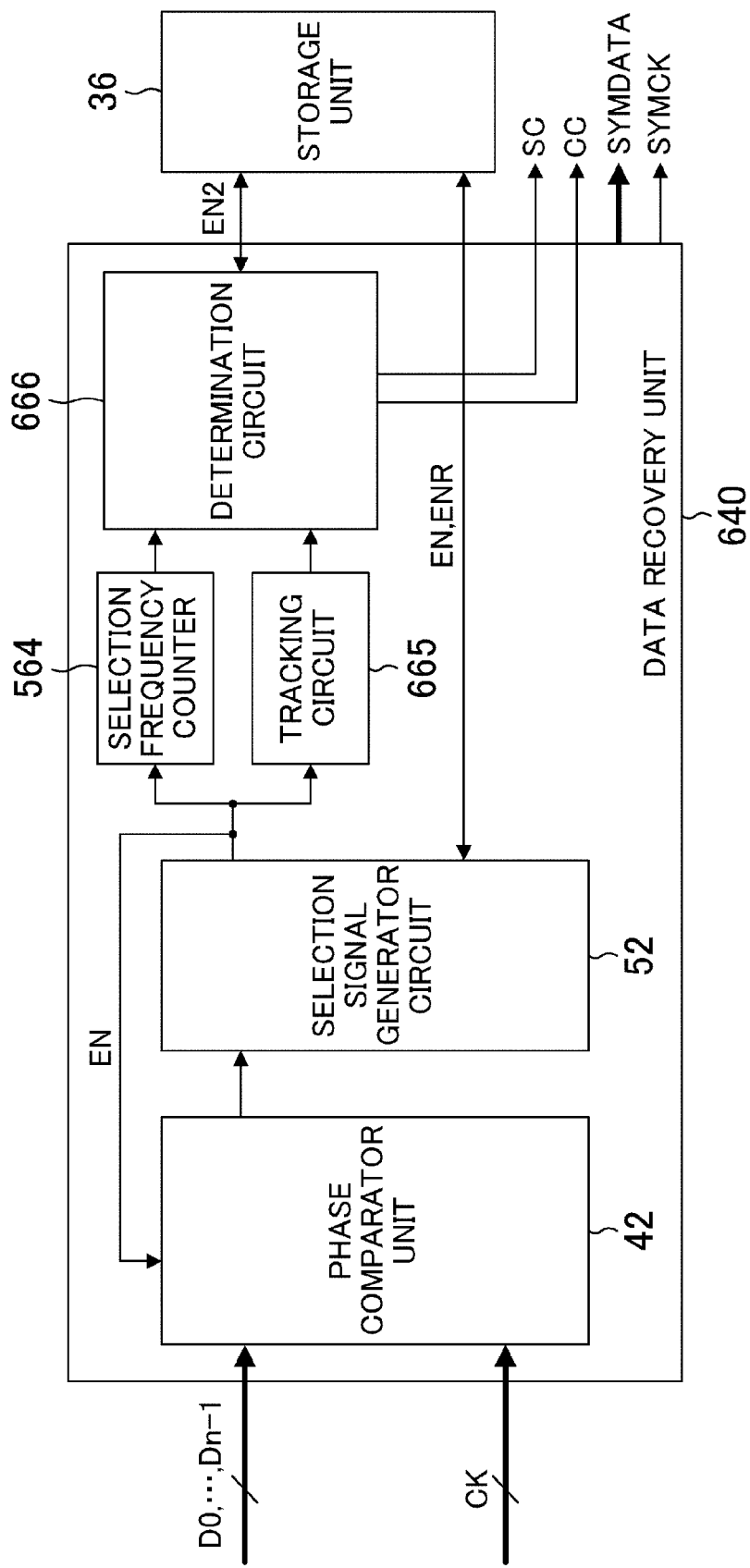

CLOCK AND DATA RECOVERY CIRCUIT

CROSS-REFERENCE TO RELATED APPLICATION

This is a continuation of PCT International Application PCT/JP2010/004392 filed on Jul. 5, 2010, which claims priority to Japanese Patent Application No. 2009-159855 filed on Jul. 6, 2009. The disclosures of these applications including the specifications, the drawings, and the claims are hereby incorporated by reference in its entirety.

BACKGROUND

The technology disclosed in this specification relates to clock and data recovery circuits which extract data from data signals and recover clocks synchronized therewith.

Widespread use of multimedia technologies has led to an increasing demand for transferring a large amount of data at a high speed. Thus, attention is given to high-speed serial data interfaces, such as serial AT Attachment (ATA), Universal Serial Bus (USB), etc. High-speed serial data interfaces require reduction in the time needed for recovering clocks and data as the data transfer rates increase.

Examples of a circuit for performing data recovery using a multiphase clock are described in Japanese Patent Publication Nos. 2006-262165, 2007-184847, and 2004-128980.

SUMMARY

Not only reduction in the time needed for recovering is required, but also improvement in the recovery accuracy during data communication is required. However, an improvement in the recovery accuracy requires a multiphase clock having more clocks and/or oversampling using a clock having a higher frequency, which results in increase of power consumption and circuit area. In addition, a need for taking into account skew and jitter presents difficulties in the implementation. Moreover, an increase in the number of phases in a multiphase clock results in a longer time to determine an optimum clock. That is, it is difficult to reduce the recovery time of a clock and data, and at the same time, to maintain the recovery accuracy and other characteristics (e.g., low power consumption, small circuit area, low skew, and low jitter).

It is an object of the present disclosure to reduce the time needed for clock and data recovery while reducing degradation in the recovery accuracy and reducing increase in the power consumption.

A clock and data recovery circuit according to an embodiment of the present invention includes a multiphase clock generator circuit configured to generate a multiphase clock having a plurality of clocks, a sampling circuit configured to sample a received data signal transferring serial data in synchronism with each of the plurality of clocks, and to generate a plurality of data signals respectively representing values sampled in synchronism with the respective plurality of clocks, a data recovery unit configured to generate a selection signal indicating a data signal having an appropriate phase among the plurality of data signals, and a storage unit configured to store the selection signal. The data recovery unit selects one of the plurality of data signals based on the selection signal read from the storage unit, selects a clock corresponding to the selected data signal from the plurality of clocks or from clocks which are generated by respectively dividing frequencies of the plurality of clocks, and outputs the selected data signal and the selected clock.

According to this configuration, the storage unit stores the generated selection signal, and the data recovery unit selects a data signal and a clock based on the stored selection signal, and receives data. Accordingly, for example, storing, by the storage unit, a selection signal generated during an initialization period for receiving a data signal can reduce the time needed for clock and data recovery during a data communication period.

According to an example embodiment of the present invention, the time needed for clock and data recovery can be reduced while reducing degradation in the recovery accuracy and reducing increase in the power consumption, in the circuit area, etc.

BRIEF DESCRIPTION OF THE DRAWINGS

FIG. 19A is an illustrative diagram of an example of selection frequencies of the respective data signals Di. FIG. 19B is an illustrative diagram of another example of selection frequencies of the respective data signals Di.

FIG. 20 is a block diagram illustrating a configuration of a fourth variation of the data recovery unit of FIG. 2.

DETAILED DESCRIPTION

Figure 1:
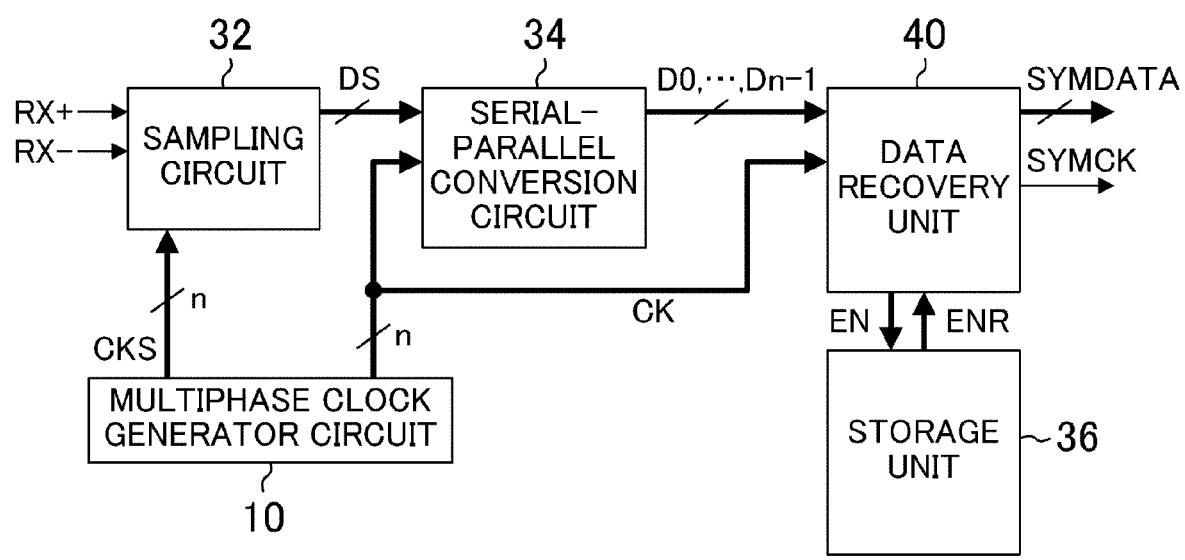
FIG. 1 is a block diagram illustrating a configuration of a clock and data recovery circuit according to an example embodiment of the present invention.

An example embodiment of the present invention will be described below with reference to the drawings, in which reference numerals having the same last two digits indicate the same or similar components corresponding to one another.

FIG. 1 is a block diagram illustrating a configuration of a clock and data recovery circuit according to the example embodiment of the present invention. By way of example, it is assumed that the clock and data recovery circuit of FIG. 1 is included in a device for receiving a differential data signal from a host. The clock and data recovery circuit of FIG. 1 includes a multiphase clock generator circuit 10, a sampling circuit 32, a serial-parallel conversion circuit 34, a storage unit 36, and a data recovery unit 40.

The multiphase clock generator circuit 10 includes a phase-locked loop (PLL). The multiphase clock generator circuit 10 generates a multiphase clock CKS and outputs the multiphase clock CKS to the sampling circuit 32. In addition, the multiphase clock generator circuit 10 divides the frequency of the multiphase clock CKS by two, and outputs the generated multiphase clock CK to both the serial-parallel conversion circuit 34 and the data recovery unit 40. The multiphase clocks CKS and CK each include n (where n is an integer satisfying n≥2) clocks having phases different from one another.

The sampling circuit 32 receives a differential data signal (RX+ and RX−) sent from a host etc. and transferring serial data, samples the differential data signal in synchronism with each of the n clocks included in the multiphase clock CKS, and outputs the sampled values to the serial-parallel conversion circuit 34 as data signals DS[n−1:0] respectively corresponding to the n clocks.

As used herein, data signals DS[n−1:0] represent n data signals DS[0], DS[1], . . . , and DS[n−1]. A similar notation is also applied to the representation of other signals. The differential data signal received by the sampling circuit 32 (hereinafter referred to as received data signal) is a signal compliant to a standard of, for example, serial ATA, USB, IEEE 1394, Gigabit Ethernet (IEEE 802.3-2005), or Fibre Channel.

The serial-parallel conversion circuit 34 performs a serial-to-parallel conversion on the data signals DS[0]-DS[n−1] based on the multiphase clock CK, and outputs the converted parallel data signals D0, D1, . . . , and Dn−1 to the data recovery unit 40. The data signals DS[0], DS[1], . . . , and DS[n−1] respectively correspond to the data signals D0, D1, . . . , and Dn−1. More specifically, the serial-parallel conversion circuit 34 generates the converted parallel data signals Di (where i is an integer satisfying 0≤i<n) each transferring, at a time, two bits of data in parallel which have been transferred by a corresponding one of the data signals DS[i], and outputs the data signals Di in synchronism with the corresponding clocks included in the multiphase clock CK.

The data recovery unit 40 performs a clock and data recovery operation, determines a data signal having an appropriate phase (i.e., a data signal which allows stable data detection) among the data signals D0-Dn−1, and generates a selection signal EN indicating this data signal. The storage unit 36 stores the value of the selection signal EN generated during at least a part of the initialization period for the received data signal.

Thereafter, for example, before the beginning of data communication, the data recovery unit 40 reads the value stored in the storage unit 36 as a selection signal ENR, and uses the selection signal ENR as an initial value of the selection signal EN. In a period including the data communication period of the received data signal, the data recovery unit 40 restarts the clock and data recovery operation. That is, the data recovery unit 40 selects, based on this initial value, one of the data signals D0-Dn−1 and one of the clocks CK[0]-CK[n−1] corresponding to that data signal, and outputs the selected ones respectively as a data signal SYMDATA and as a clock SYMCK.

Figure 2:
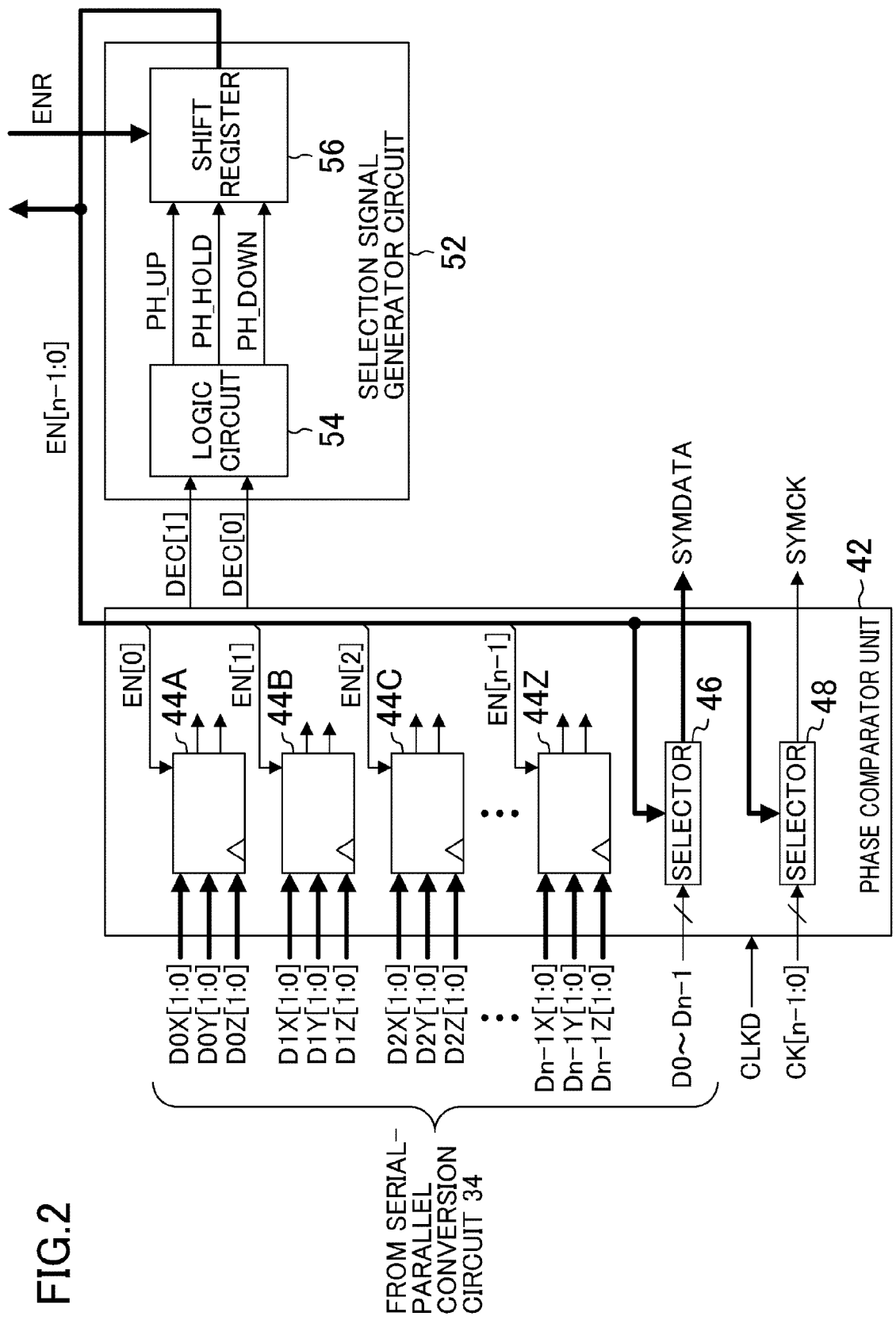
FIG. 2 is a block diagram illustrating an example configuration of the data recovery unit of FIG. 1.

FIG. 2 is a block diagram illustrating an example configuration of the data recovery unit 40 of FIG. 1. The data recovery unit 40 includes a phase comparator unit 42 and a selection signal generator circuit 52. The phase comparator unit 42 includes n phase comparators 44A, 44B, 44C, . . . , and 44Z, and selectors 46 and 48. The selection signal generator circuit 52 includes a logic circuit 54 and a shift register 56.

The phase comparator 44A receives data signals D0X[1:0], D0Y[1:0], and D0Z[1:0]. The phase comparator 44B receives data signals D1X[1:0], D1Y[1:0], and D1Z[1:0]. The other phase comparators receive different data signals in a similar manner. Here, the data signal D1Y[1:0] input to the phase comparator 44B is the data signal D1. The data signal D1X[1:0] is the same as the data signal D0Y[1:0] (=D0) input to the adjacent phase comparator 44A. The data signal D1Z[1:0] is the same as the data signal D2Y[1:0] (=D2) input to the adjacent phase comparator 44C. This relationship also applies to the other phase comparators. The phase comparators 44A and 44Z are deemed to be provided next to each other. That is:

$$D1X[1:0]=D0Y[1:0]=Dn-1Z[1:0]=D0$$

$$D2X[1:0]=D1Y[1:0]=D0Z[1:0]=D1$$

$$D3X[1:0]=D2Y[1:0]=D1Z[1:0]=D2$$

$$D0X[1:0]=Dn-1Y[1:0]=Dn-2Z[1:0]=Dn-1.$$

The phase comparators 44A-44Z respectively receive the bits EN[0], EN[1], EN[2], . . . , and EN[n−1] of the selection signal EN. Of the n bits of the selection signal EN, only one bit is "1," and the other bits are "0." The phase comparators 44A-44Z latch the input data signals DiX, DiY, and DiZ (where i is an integer satisfying 0≤i<n) in synchronism with a clock CLKD. The clock CLKD is one of the clocks CK[0]-CK[n−1].

The phase comparators 44A-44Z output detection signals DEC[0] and DEC[1] each representing a phase relationship of the clock CLKD with respect to the input data signals DiX, DiY, and DiZ only when the input bit of the selection signal EN is "1." That is, the detection signals DEC[0] and DEC[1] indicate whether the data signal indicated by the selection signal EN, of the data signals D0-Dn−1, has an appropriate phase or not. The detection signal DEC[0] corresponds to DiX[0], DiY[0], and DiZ[0], and the detection signal DEC[1] corresponds to DiX[1], DiY[1], and DiZ[1].

Thus, each of the phase comparators 44A-44Z receives the data signal Di−1 as the data signal DiX, and receives the data signal Di+1 as the data signal DiZ. Instead, each of the phase comparators 44A-44Z may receive the data signal Di−2 etc. having a larger phase lead as the data signal DiX, and may receive the data signal Di+2 etc. having a larger phase lag as the data signal DiZ.

Figure 3:
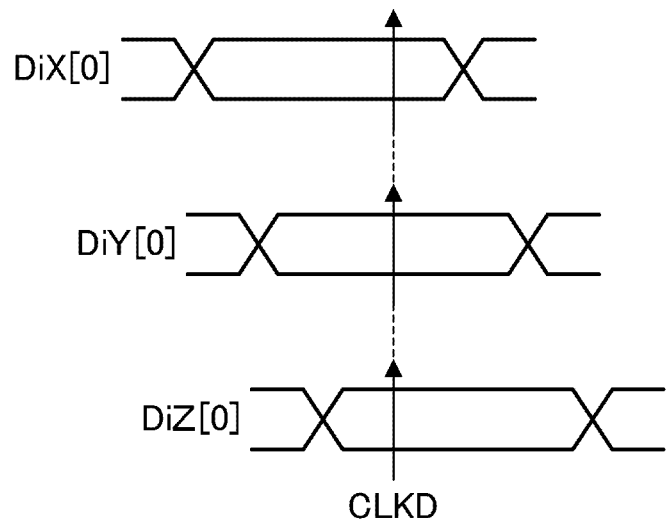
FIG. 3 is an illustrative diagram of an example of the relationships between the respective data signals and the clock CLKD input to the phase comparators of FIG. 2.

FIG. 3 is an illustrative diagram of an example of the relationships between the respective data signals and the clock CLKD input to the phase comparator 44A etc. of FIG. 2. FIG. 3 illustrates the timing of changes of the values represented by the data signals DiX[0] etc. In the phase comparator which receives the data signals DiX[0], DiY[0], and DiZ[0], the relationship between the data signal DiX[0] and the clock CLKD, the relationship between the data signal DiY[0] and the clock CLKD, and the relationship between the data signal DiZ[0] and the clock CLKD are as shown in FIG. 3.

Figure 4A:
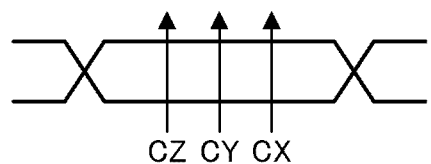
FIG. 4A is an illustrative diagram summarily illustrating the relationships between the data signals and the clock of FIG. 3.
Figure 4B:
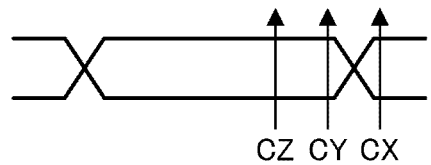
FIG. 4B is an illustrative diagram of an example of the clock having a phase lag with respect to the clock of FIG. 4A.
Figure 4C:
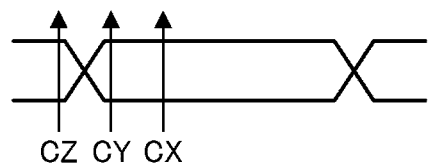
FIG. 4C is an illustrative diagram of an example of the clock having a phase lead with respect to the clock of FIG. 4A.

FIG. 4A is an illustrative diagram summarily illustrating the relationships between the data signals DiX[0], DiY[0], and DiZ[0] and the clock CLKD of FIG. 3. FIG. 4B is an illustrative diagram of an example of the clock CLKD having a phase lag with respect to the clock of FIG. 4A. FIG. 4C is an illustrative diagram of an example of the clock CLKD having a phase lead with respect to the clock of FIG. 4A. Here, the following description assumes that the selection signal EN[0]=1. In any case of FIGS. 4A-4C, the phase comparator 44A samples the data signals D0X[0], D0Y[0], and D0Z[0] at the times CX, CY, and CZ.

In the case of FIG. 4A, the values latched by the phase comparator 44A are all the same for the data signals D0X[0], D0Y[0], and D0Z[0]. In this case, the relationships between the data signals and the clock CLKD are appropriate, and thus the phase comparator 44A outputs a detection signal DEC[0] representing "hold" to the logic circuit 54.

In the case of FIG. 4B, among the values latched by the phase comparator 44A, only the value obtained from the data signal D0X[0] having a phase lead can be different from the values obtained from the data signals D0Y[0] and D0Z[0]. In this case, the phase of the clock CLKD needs to be relatively advanced, and thus the phase comparator 44A outputs a detection signal DEC[0] representing "up" to the logic circuit 54.

In the case of FIG. 4C, among the values latched by the phase comparator 44A, only the value obtained from the data signal D0Z[0] having a phase lag can be different from the values obtained from the data signals D0X[0] and D0Y[0]. In this case, the phase of the clock CLKD needs to be relatively delayed, and thus the phase comparator 44A outputs a detection signal DEC[0] representing "down" to the logic circuit 54. The phase comparator 44A also performs a similar operation for the data signals D0X[1], D0Y[1], and D0Z[1], and outputs the result to the logic circuit 54 as the detection signal DEC[1].

Figures 5, 6:
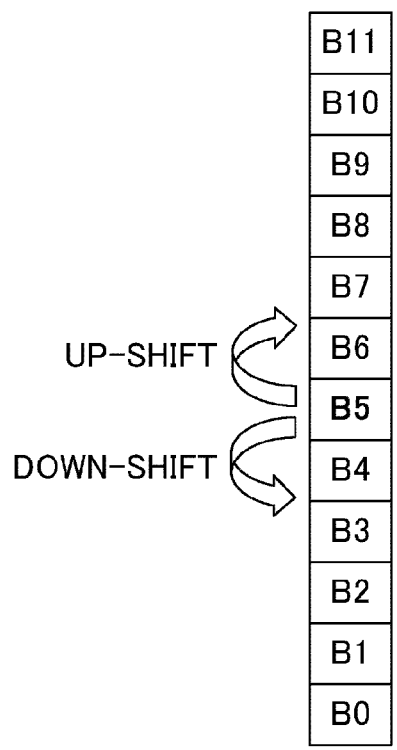
FIG. 5 is an illustrative diagram of an example operation of the logic circuit of FIG. 2.
FIG. 6 is an illustrative diagram of an example of the shift register of FIG. 2.

FIG. 5 is an illustrative diagram of an example operation of the logic circuit 54 of FIG. 2. The logic circuit 54 of FIG. 2 outputs signals PH_UP, PH_HOLD, and PH_DOWN to the shift register 56 based on the combination of the detection signals DEC[0] and DEC[1]. More specifically, the logic circuit 54 only sets the signal PH_UP to "1" if the data should be up shifted, only sets the signal PH_HOLD to "1" if the data should be held, and only sets the signal PH_DOWN to "1" if the data should be down shifted.

FIG. 6 is an illustrative diagram of an example of the shift register 56 of FIG. 2. By way of example, it is assumed that n=12. The bits B0-B11 of the shift register 56 respectively correspond to the data signals D0-D11. For example, if the shift register 56 stores "1" only in the bit B5, then the shift register 56 shifts the value "1" to the bit B6 if the signal PH_UP is "1," and shifts the value "1" to the bit B4 if the signal PH_DOWN is "1." If the signal PH_HOLD is "1," then the shift register 56 performs no shift operations. The shift register 56 outputs all the stored bits B0-B11 to both the phase comparator unit 42 and the storage unit 36 as the selection signals EN[0]-EN[n−1].

The selector 46 selects the data signal whose corresponding selection signal is "1" from the data signals D0, D1, . . . , and Dn−1 respectively corresponding to the selection signals EN[0], EN[1], . . . , and EN[n−1], and then outputs the selected data signal as the data signal SYMDATA. The selector 48 selects the clock whose corresponding selection signal is "1" from the clocks CK[0], CK[1], . . . , and CK[n−1] respectively corresponding to the selection signals EN[0], EN[1], . . . , and EN[n−1], and then outputs the selected clock as the clock SYMCK.

Figure 7:
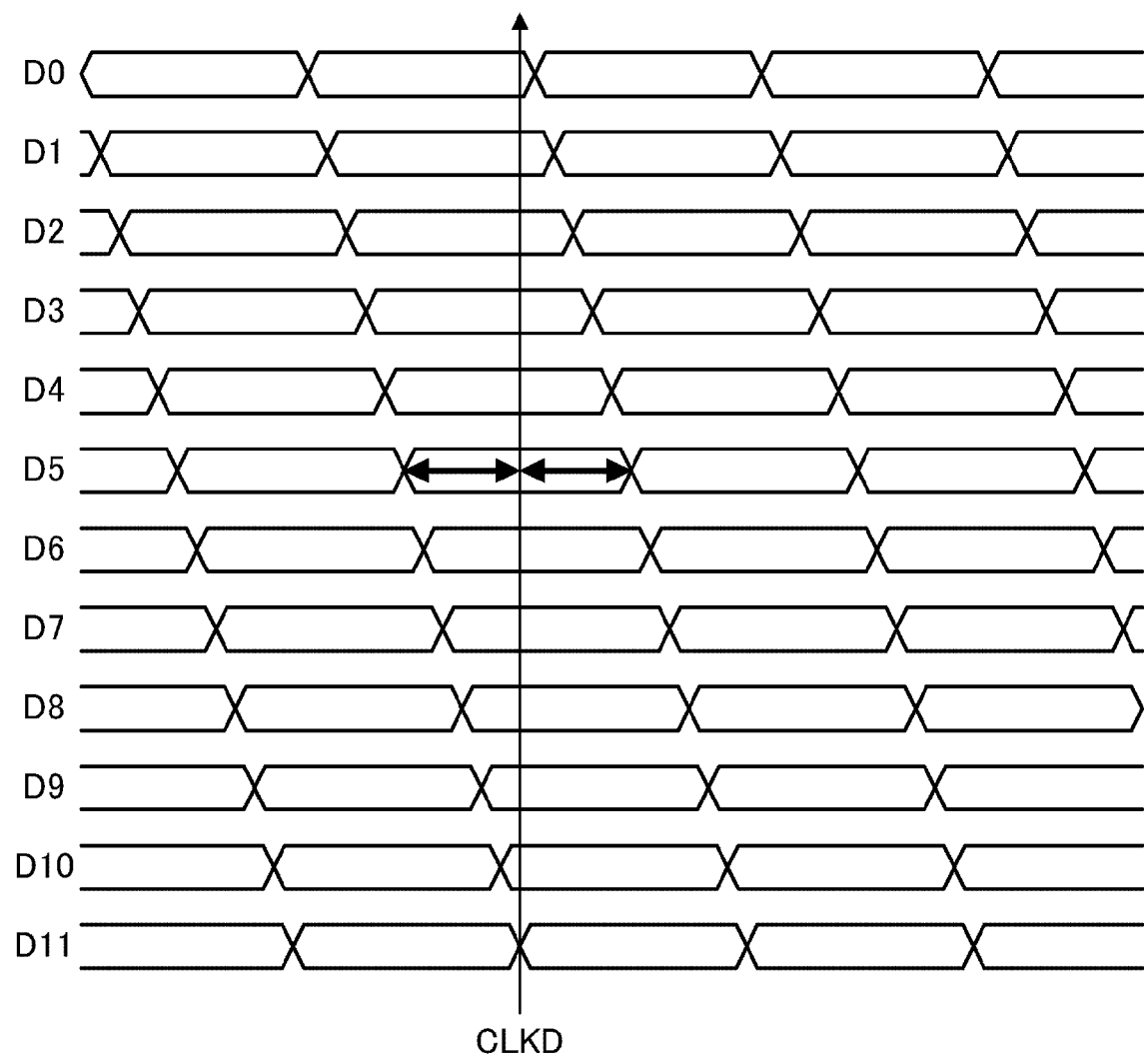
FIG. 7 is a timing diagram illustrating an example of the relationships between the data signals D0-D11 and the clock CLKD input to the data recovery unit of FIG. 2.

FIG. 7 is a timing diagram illustrating an example of the relationships between the data signals D0-D11 and the clock CLKD input to the data recovery unit 40 of FIG. 2. The operation of the data recovery unit 40 as described above causes, for example, the selection signal EN[5] to be "1," thereby causing the selectors 46 and 48 to respectively output the data signal D5 and the clock CK[5] as the data signal SYMDATA and as the clock SYMCK. In this operation, the selected data signal D5 provides sufficient times between the changes in the value and the transition of the clock CLKD both before and after the transition of the clock CLKD. The clock and data recovery operation is performed as described above.

Figure 8:
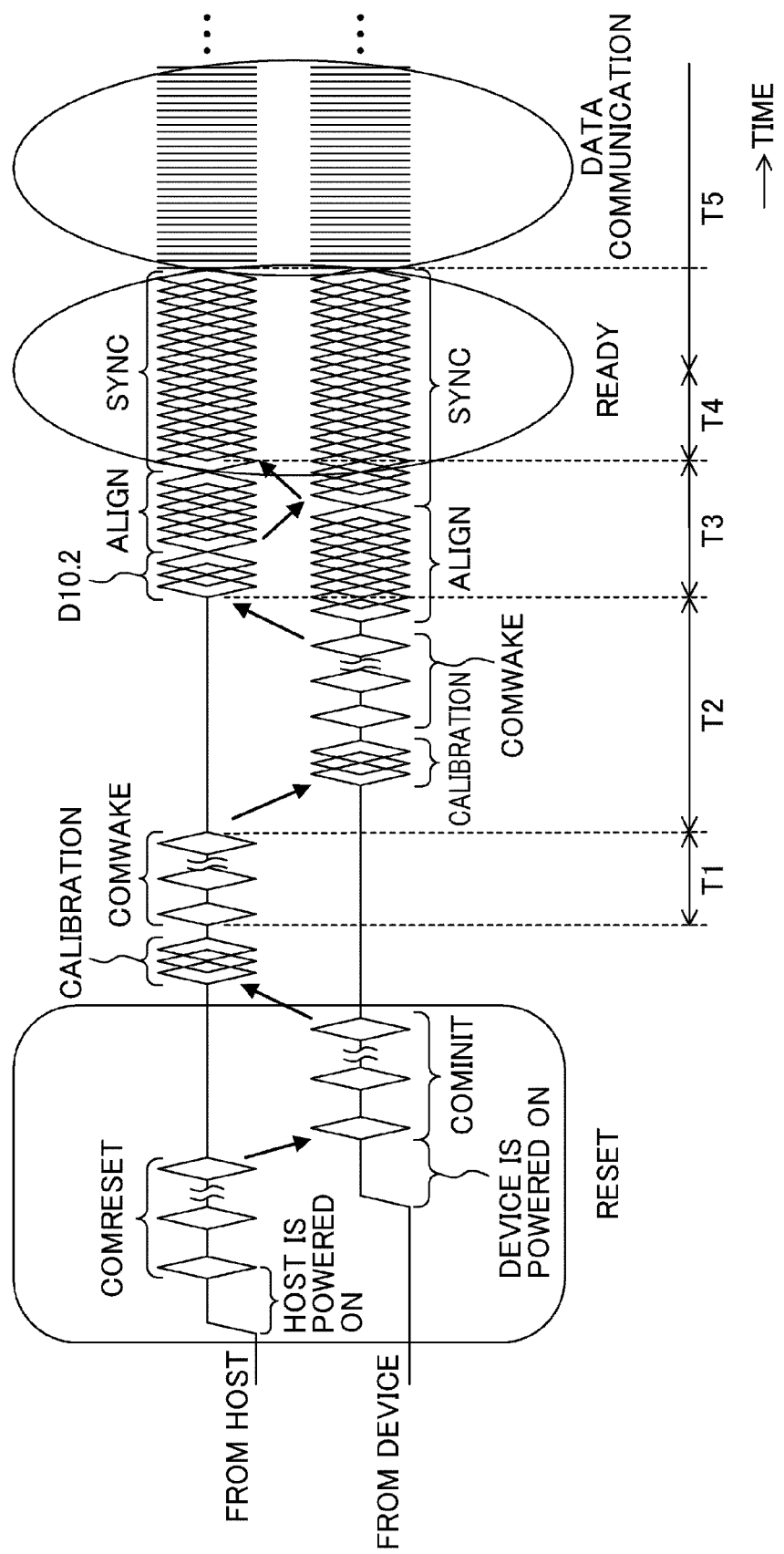
FIG. 8 is a timing diagram illustrating an example sequence of data communication using a serial ATA protocol.

FIG. 8 is a timing diagram illustrating an example sequence of data communication using a serial ATA protocol. FIG. 8 illustrates a signal sent from a host to a device including the clock and data recovery circuit of FIG. 1, and a signal sent from the device to the host.

The serial ATA standard defines COMRESET, COMINIT, and COMWAKE as out-of-band (OOB) signals. Each of the OOB signals has a signal formed by four iterative bit patterns, each referred to as ALIGN Primitive which has 40 bits (160 bits in total), and an idle interval (COMRESET and COMINIT: 480 UI (unit interval), COMWAKE: 160 UI). After the COMWAKE, a bit patter referred to as D10.2 (an alternation of ones and zeros), and an ALIGN Primitive (K28.5->D10.2->D10.2->D27.3) are sent. These sent signals allow identification of both an initialization period (a period from the power-on to the completion of handshake; e.g., the period from the power-on to the beginning of data communication of FIG. 8) and a data communication period (e.g., the period of data communication of FIG. 8) for a received data signal.

For example, the storage unit 36 includes either a timer circuit for counting pulses of a clock having a period of 1 UI and thus measuring a time, or a bit pattern comparison circuit for comparing a received bit pattern with a predetermined known bit pattern. The storage unit 36 uses either the timer circuit or the bit pattern comparison circuit to identify both the initialization period and the data communication period for the received data signal.

In addition, the storage unit 36 stores and outputs flags indicating the beginning and the end of the initialization period and the beginning of the data communication period.

For example, the data recovery unit 40 performs data communication following the sequence described below. In a part of the initialization period for a received data signal (e.g., the period T1 (COMWAKE) of FIG. 8), the data recovery unit 40 performs the clock and data recovery operation, and generates the selection signal EN indicating an appropriate data signal and the clock corresponding thereto as described above referring to FIGS. 1-7. In the period T2, the storage unit 36 stores the value of the selection signal EN.

In the periods T3-T5 including the data communication period for the received data signal, the data recovery unit 40 reads the value of the selection signal EN stored in the storage unit 36 as the selection signal ENR, and the shift register 56 uses the value of the selection signal ENR as the initial value. In these periods, the data recovery unit 40 restarts the clock and data recovery operation based on the selection signal EN read from the storage unit 36, and performs data communication. Since the value of the selection signal EN generated in the period T1 is used as the initial value in the shift register 56, an appropriate data signal and an appropriate clock can be readily selected, thereby allowing the time needed for clock and data recovery to be reduced. Usage of a data signal and a clock already obtained by a clock and data recovery operation prevents the recovery accuracy from being degraded. Moreover, since there is no need to use a clock having a high frequency or to use a large number of clocks, the power consumption and the circuit area can be reduced.

The data recovery unit 40 may perform data communication following the sequence described below. In the periods T1-T3 of FIG. 8, the data recovery unit 40 performs the clock and data recovery operation, and generates the selection signal EN. In the period T4, the storage unit 36 stores the value of the selection signal EN. In the period T5, the data recovery unit 40 reads the stored value as the selection signal ENR, and the shift register 56 uses the value of the selection signal ENR as the initial value. The data recovery unit 40 restarts the clock and data recovery operation, and performs data communication.

Figure 9:
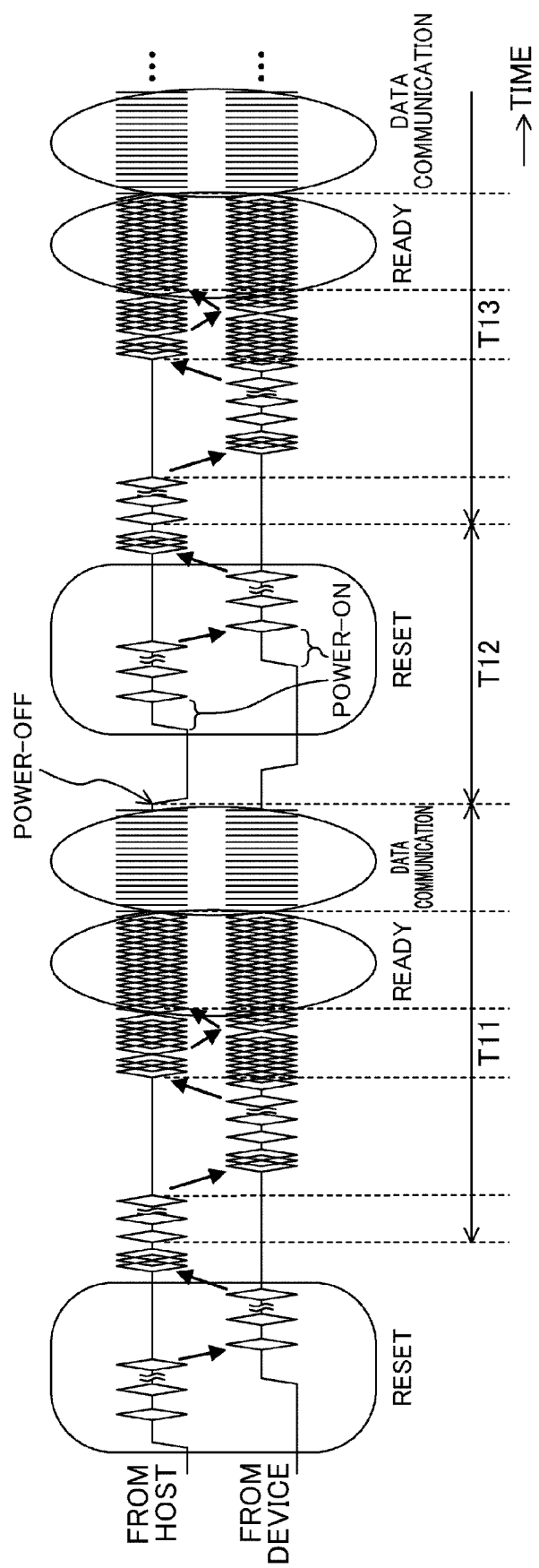
FIG. 9 is a timing diagram illustrating an example sequence of data communication using a serial ATA protocol when a power-on reset occurs after a data communication period.

FIG. 9 is a timing diagram illustrating an example sequence of data communication using a serial ATA protocol when a power-on reset occurs after a data communication period. In the period T11 of FIG. 9, the data recovery unit 40 performs the clock and data recovery operation, and generates the selection signal EN. In the period T12, when the host is powered off, the storage unit 36 stores the value of the selection signal EN; thereafter, the host is powered on. In the period T13, the data recovery unit 40 reads the stored value as the selection signal ENR, and the shift register 56 uses the value of the selection signal ENR as the initial value. The data recovery unit 40 restarts the clock and data recovery operation, and then performs data communication.

Figure 10:
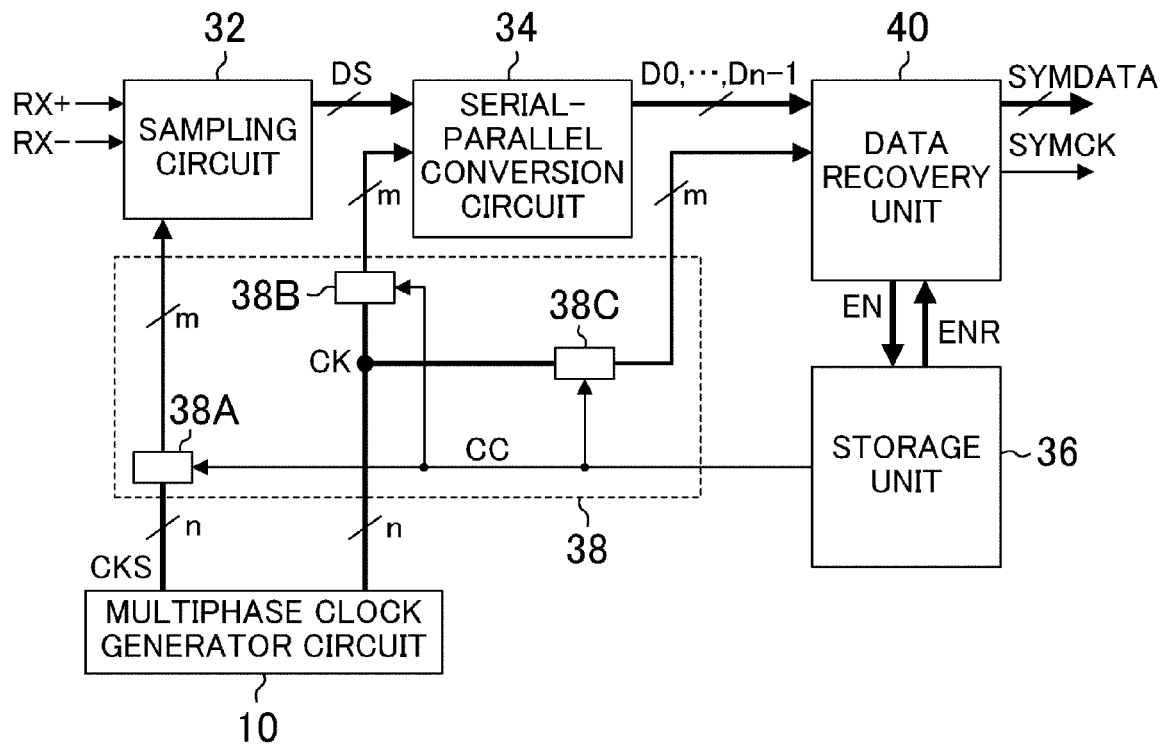
FIG. 10 is a block diagram illustrating a configuration of a first variation of the clock and data recovery circuit of FIG. 1.

FIG. 10 is a block diagram illustrating a configuration of a first variation of the clock and data recovery circuit of FIG. 1. The clock and data recovery circuit of FIG. 10 differs from that of FIG. 1 in further including a clock selection unit 38. The clock selection unit 38 includes clock selection circuits 38A, 38B, and 38C.

The storage unit 36 identifies both the initialization period and the data communication period for the received data signal, and generates a clock control signal CC indicating at least a part of the initialization period (e.g., the periods T1 and T2 of FIG. 8) and a period during which the data recovery unit 40 operates based on the selection signal ENR read from the storage unit 36 (e.g., the periods T3-T5 of FIG. 8). More specifically, the storage unit 36 outputs as the clock control signal CC, to the clock selection circuits 38A-38C, a value with all the bits set to "1" in the periods T1 and T2 of FIG. 8, and the read value of the selection signal ENR (the stored value of the selection signal EN) in the periods T3-T5 which includes a period during which the clock and data recovery operation is restarted, and data communication is performed.

The clock selection circuit 38A selects m (where m is a natural number satisfying m <n) clocks from the clocks CKS[0]-CKS[n−1] included in the multiphase clock CKS based on the clock control signal CC, and supplies the m clocks to the sampling circuit 32. The clock selection circuits 38B and 38C both select m clocks from the clocks CK[0]-CK[n−1] included in the multiphase clock CK based on the clock control signal CC. Each of the clock selection circuits 38A-38C selects, for example, clocks respectively corresponding to bits having a value of "1" from the bits of the clock control signal CC. The clock selection circuits 38B and 38C respectively supply the selected clocks to the serial-parallel conversion circuit 34 and to the data recovery unit 40.

For example, if only the selection signal EN[5] is "1" and the other selection signals are "0" among the selection signals EN[0]-EN[n−1], then the clock selection circuits 38A-38C only output the clocks CKS[5] and CK[5] corresponding to the data signal D5, and output no other clocks. In such a case, the clock selection circuits 38A-38C may only output clocks CKS[5+α:5−α] and CK[5+α:5−α] (where α is a natural number less than or equal to 5 in this case).

The sampling circuit 32 includes circuits which respectively operate based on the clocks CKS[0]-CKS[n−1], and the serial-parallel conversion circuit 34 and the data recovery unit 40 each include circuits which respectively operate based on the clocks CK[0]-CK[n−1]. Accordingly, when the supply of some of the clocks included in the multiphase clocks is stopped by the clock selection circuits 38A-38C, the sampling circuit 32, the serial-parallel conversion circuit 34, and the data recovery unit 40 stop the operations of the circuits corresponding to the clocks not supplied. Such an operation can reduce the power consumption.

Figure 11:
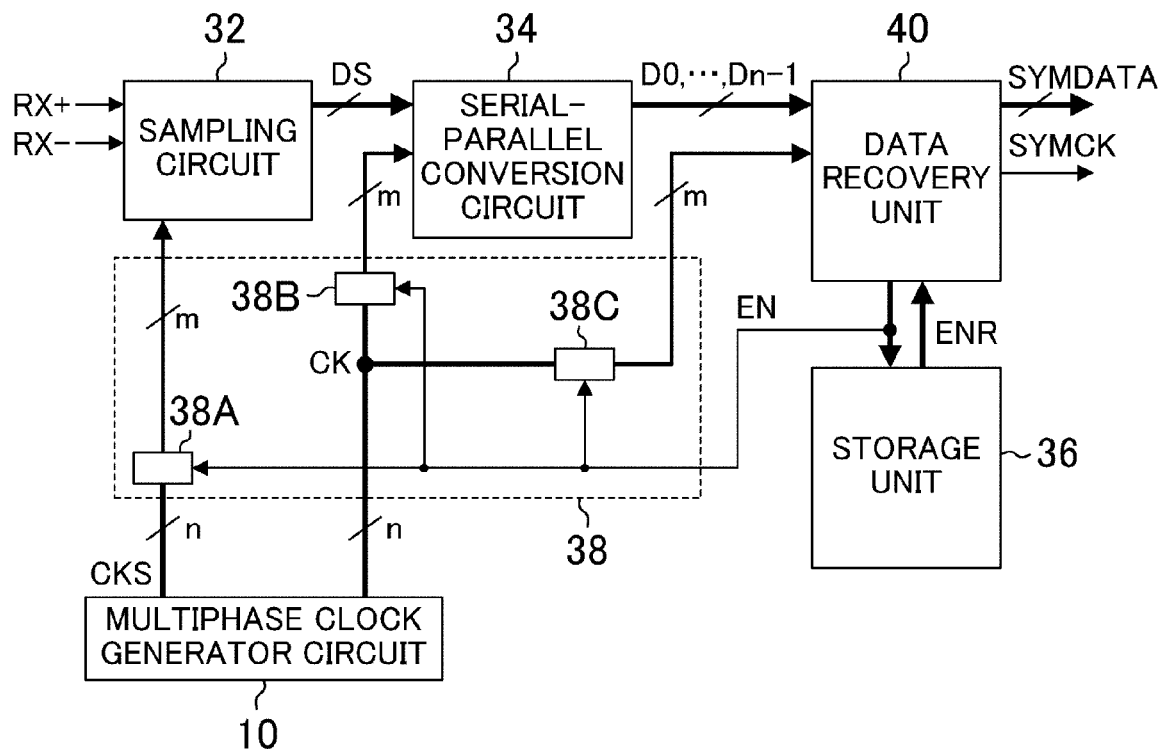
FIG. 11 is a block diagram illustrating a configuration of a second variation of the clock and data recovery circuit of FIG. 1.

FIG. 11 is a block diagram illustrating a configuration of a second variation of the clock and data recovery circuit of FIG. 1. The clock and data recovery circuit of FIG. 11 is configured similarly to the clock and data recovery circuit of FIG. 10 except that the selection signal EN is input to the clock selection circuits 38A-38C instead of the clock control signal CC. Similarly to the case of FIG. 10, the clock selection circuit 38A selects and outputs m clocks from the clocks CKS[0]-CKS[n−1] based on the selection signal EN. The clock selection circuits 38B and 38C both select and output m clocks from the clocks CK[0]-CK[n−1] based on the selection signal EN.

Figure 12:
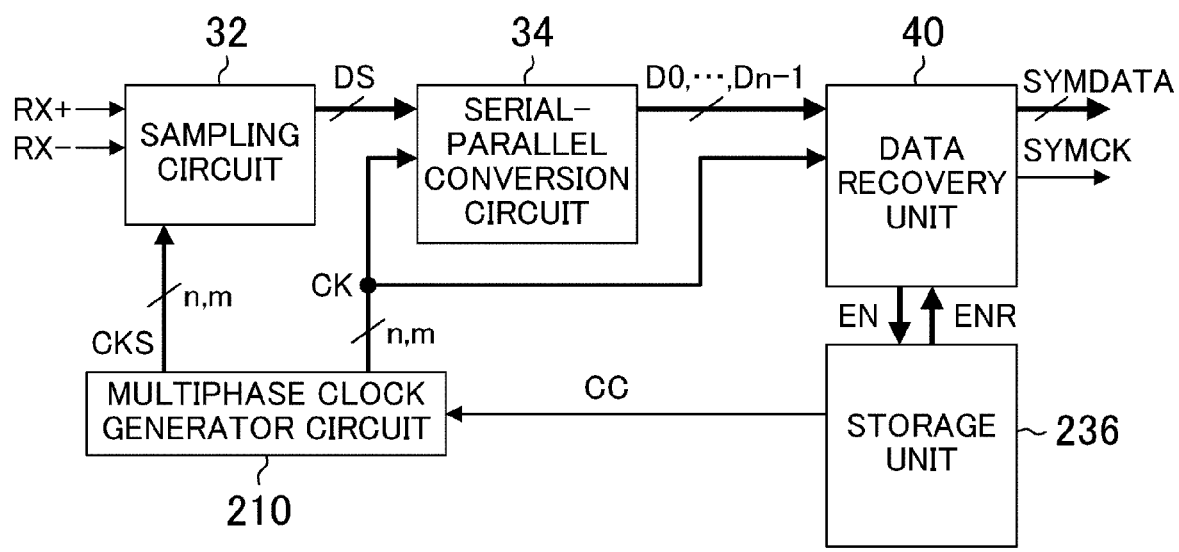
FIG. 12 is a block diagram illustrating a configuration of a third variation of the clock and data recovery circuit of FIG. 1.

FIG. 12 is a block diagram illustrating a configuration of a third variation of the clock and data recovery circuit of FIG. 1. The clock and data recovery circuit of FIG. 12 differs from that of FIG. 1 in including a multiphase clock generator circuit 210 in place of the multiphase clock generator circuit 10. The storage unit 236 identifies both the initialization period and the data communication period for the received data signal, and outputs a clock control signal CC indicating at least a part of the initialization period (e.g., low logic level "L") or a period including at least a part of the data communication period (e.g., high logic level "H"). The multiphase clock generator circuit 210 changes both the number of clocks included in the multiphase clock CKS and the number of clocks included in the multiphase clock CK to n or m based on the clock control signal CC.

Figure 13:
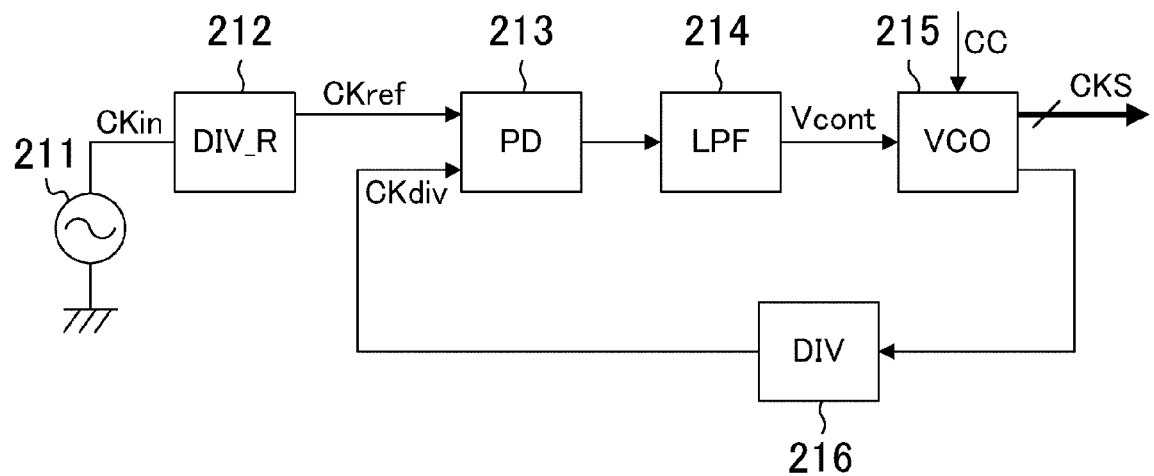
FIG. 13 is a block diagram illustrating an example configuration of the multiphase clock generator circuit of FIG. 12.

FIG. 13 is a block diagram illustrating an example configuration of the multiphase clock generator circuit 210 of FIG. 12. The multiphase clock generator circuit 210 includes an oscillator 211, frequency dividers 212 and 216, a phase comparator 213, a low-pass filter 214, and a voltage-controlled oscillator (VCO) 215.

The oscillator 211 generates a reference signal CKin. The frequency divider 212 divides the frequency of the reference signal CKin, thereby generates a reference signal CKref. The phase comparator 213 compares the phases of the reference signal CKref and of an output signal CKdiv of the frequency divider 216, and outputs the comparison result. The low-pass filter 214 smoothes the phase comparison result, thereby generates an oscillation control signal Vcont. The VCO 215 generates a multiphase clock CKS having a frequency which depends on the oscillation control signal Vcont. The frequency divider 216 divides the frequency of one of the clocks included in the multiphase clock CKS, thereby generates the output signal CKdiv. Although not shown in FIG. 13, the multiphase clock generator circuit 210 divides the frequency of the multiphase clock CKS, thereby generates a multiphase clock CK.

Figure 14:
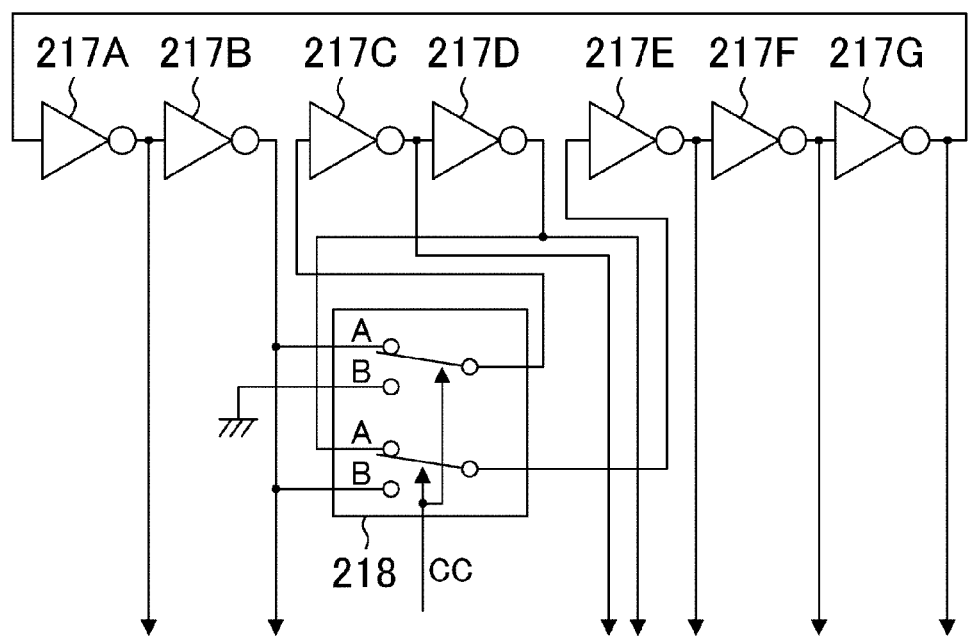
FIG. 14 is a block diagram illustrating an example configuration of the VCO of FIG. 13.

FIG. 14 is a block diagram illustrating an example configuration of the VCO 215 of FIG. 13. The VCO 215 includes inverters 217A, 217B, . . . , and 217G, and a selector 218. By way of example, a case of m=7 and n=5 will be described. For example, if the clock control signal CC is "L," the selector 218 selects signals A. In this case, the inverters 217A-217G form a seven-stage inverter chain. The inverters 217A-217G output the respective outputs as clocks included in the multiphase clock CKS.

For example, if the clock control signal CC is "H," the selector 218 selects signals B. In this case, the inverters 217A, 217B, and 217E-217G form a five-stage inverter chain. The inverters 217A, 217B, and 217E-217G output the respective outputs as clocks included in the multiphase clock CKS.

According to the multiphase clock generator circuit 210 of FIG. 12, the delay in the inverter chain of the VCO 215 is reduced, thereby allowing the power consumption to be reduced not only in the sampling circuit 32 etc., which operates based on the multiphase clock CKS etc., but also in the VCO 215.

If an appropriate data signal cannot be determined, the selector 218 may select the signals B in the initialization period, and select the signals A in the data communication period. Such an operation allows more clocks to be included in the multiphase clock CKS etc. in the data communication period than in the initialization period. Although the above description assumes that the number of clocks is switched to five or seven, the number of clocks may be switched to other numbers.

Figure 15:
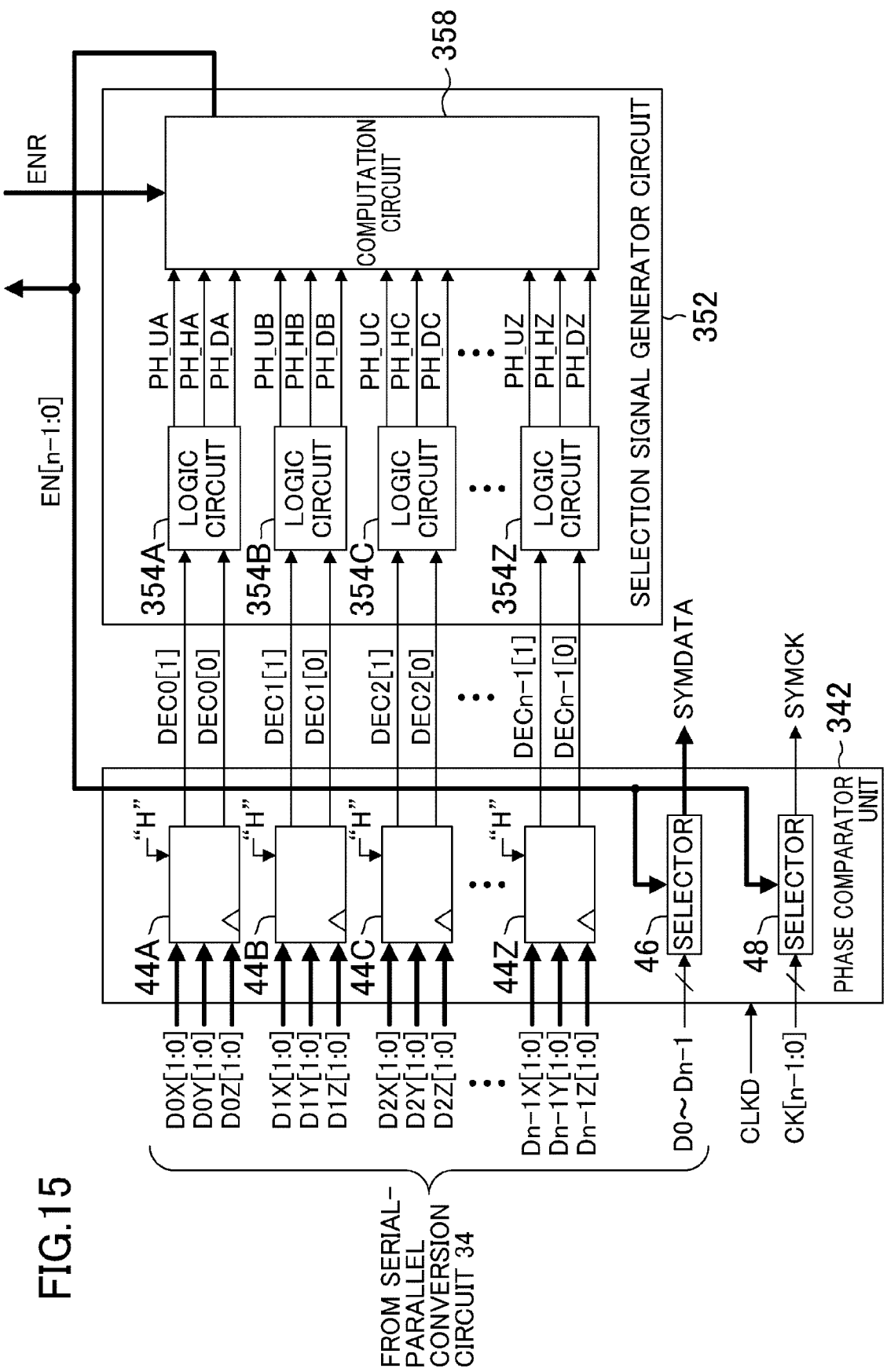
FIG. 15 is a block diagram illustrating a configuration of a first variation of the data recovery unit of FIG. 2.

FIG. 15 is a block diagram illustrating a configuration of a first variation of the data recovery unit 40 of FIG. 2. The data recovery unit of FIG. 15 and the other data recovery units described below may also be used in any of the clock and data recovery circuits of FIGS. 1 and 10-12. The data recovery unit of FIG. 15 includes a phase comparator unit 342 and a selection signal generator circuit 352.

The phase comparators 44A-44Z receive a signal "H" instead of the selection signal EN. The phase comparators 44A-44Z each output detection signals DECi[0] and DECi[1] each representing a phase relationship of the clock CLKD with respect to the input data signals DiX, DiY, and DiZ. The detection signals DECi[0] and DECi[1] respectively correspond to the detection signals DEC[0] and DEC[1] of FIG. 2. In other words, the combinations of the detection signals DECi[0] and DECi[1] respectively indicate whether the data signals D0-Dn−1 have appropriate phases or not.

The selection signal generator circuit 352 includes logic circuits 354A, 354B, 354C, . . . , and 354Z, and a computation circuit 358. The logic circuits 354A-354Z each operate similarly to the logic circuit 54 of FIG. 2. That is, the logic circuit 354A only sets a signal PH_UA to "1" if the data should be up shifted, only sets a signal PH_HA to "1" if the data should be held, and only sets a signal PH_DA to "1" if the data should be down shifted, based on the combination of the detection signals DEC0[0] and DEC0[1]. Similarly, the logic circuit 354B outputs signals PH_UB, PH_HB, and PH_DB; the logic circuit 354C outputs signals PH_UC, PH_HC, and PH_DC; and the logic circuit 354Z outputs signals PH_UZ, PH_HZ and PH_DZ.

The computation circuit 358 generates and outputs the selection signal EN indicating an optimum data signal and an optimum clock based on the output signals of the logic circuits 354A-354Z. For example, the computation circuit 358 selects the optimum one from logic circuits which each output "1" as the corresponding one of the signals PH_HA-PH_HZ among the logic circuits 354A-354Z, and generates the selection signal EN indicating the data signal and the clock corresponding to the selected logic circuit.

Figure 16:
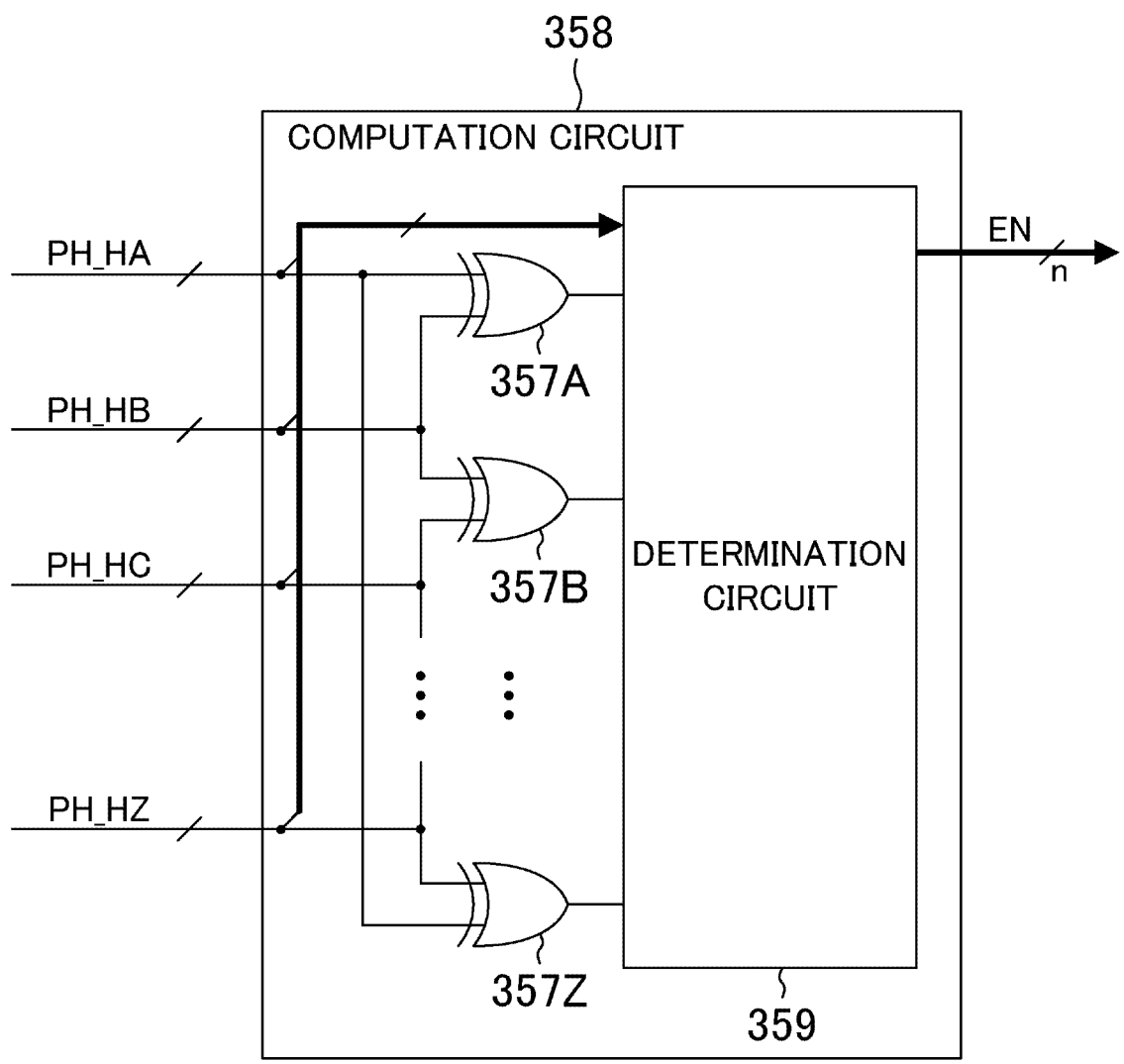
FIG. 16 is a block diagram illustrating an example configuration of the computation circuit of FIG. 15.

FIG. 16 is a block diagram illustrating an example configuration of the computation circuit 358 of FIG. 15. The computation circuit 358 includes exclusive OR (EXOR) circuits 357A, 357B, . . . , and 357Z, and a determination circuit 359. The EXOR circuits 357A-357Z together determine a boundary between a set of data signals having appropriate phases and a set of data signals having phases which are not appropriate. More specifically, two of the EXOR circuits 357A-357Z receive "1" and "0," and output "1." Each of these two circuits indicates a boundary between a set of data signals having appropriate phases and a set of data signals having phases which are not appropriate. The EXOR circuits 357A and 357Z are deemed to be provided next to each other. The determination circuit 359 determines, among the EXOR circuits 357A-357Z, a circuit which is provided farthest from the circuits each outputting "1" and thereby indicating a boundary, and which receives "1" as the two input values, and generates and outputs a selection signal EN indicating the data signal and the clock corresponding to the selected circuit.

Figure 17:
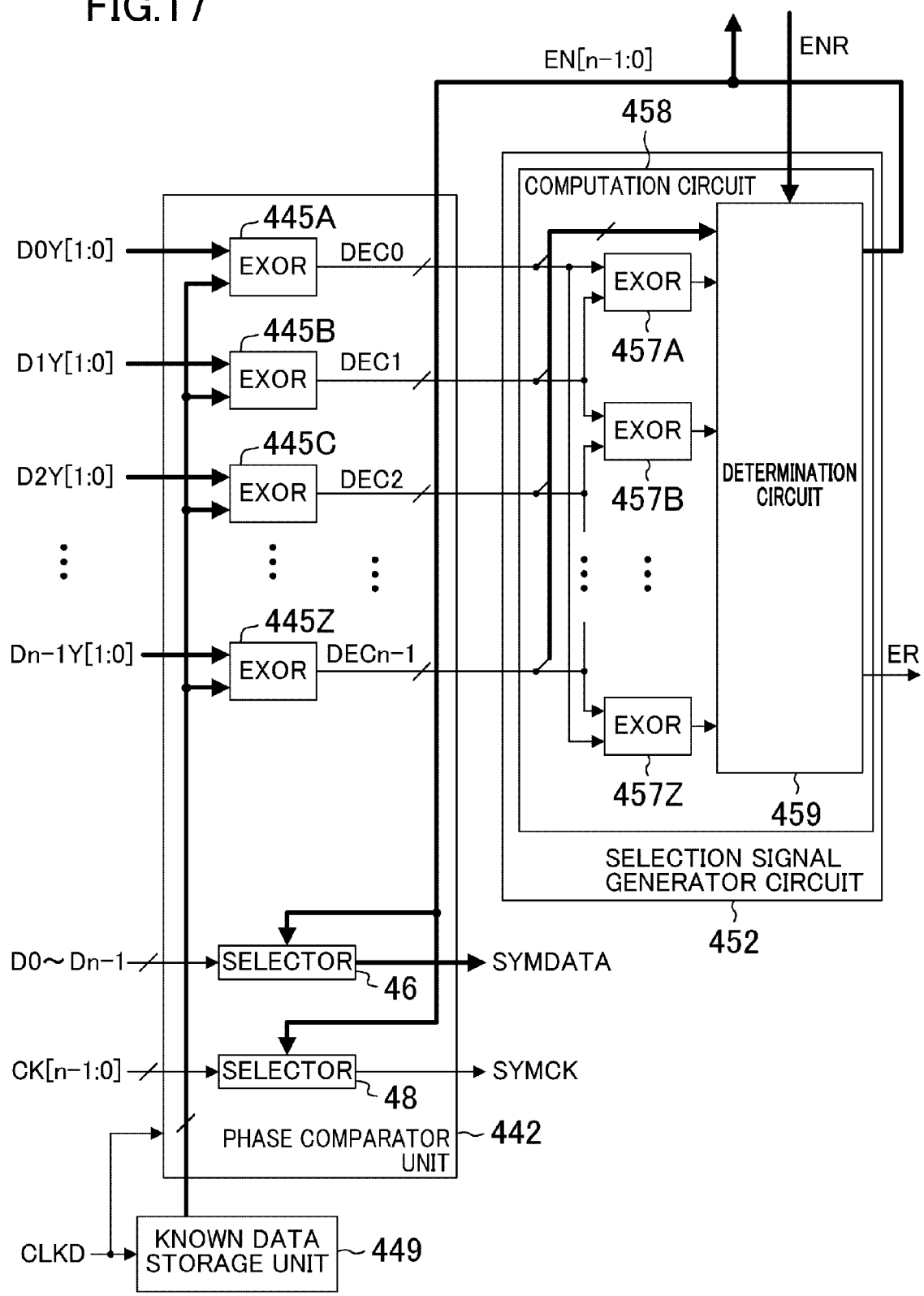
FIG. 17 is a block diagram illustrating a configuration of a part of a second variation of the data recovery unit of FIG. 2.

FIG. 17 is a block diagram illustrating a configuration of a part of a second variation of the data recovery unit 40 of FIG. 2. The data recovery unit of FIG. 17 includes a phase comparator unit 442, a known data storage unit 449, and a selection signal generator circuit 452. The phase comparator unit 442 includes EXOR circuits 445A, 445B, . . . , and 445Z, and selectors 46 and 48.

The known data storage unit 449 outputs known data (e.g., an OOB signal of serial ATA etc.) based on the clock CLKD. The phase comparator unit 442 compares the data signals DiY[0] and DiY[1] with the output data of the known data storage unit 449, and outputs the result as the detection signals DECi[0] and DECi[1].

More specifically, the EXOR circuit 445A compares the value of the data signal D0Y[1:0] with the output value of the known data storage unit 449. As the known data storage unit 449 outputs two bits at a time, the EXOR circuit 445A also makes a comparison two bits at a time, and outputs the result to the selection signal generator circuit 452 as the detection signals DECO[0] and DECO[1]. If the value of the data signal D0Y[0] is the same as the value of the known data, then DECO[0]=0; otherwise, DECO[0]=1. If the value of the data signal D0Y[1] is the same as the value of the known data, then DECO[1]=0; otherwise, DECO[1]=1. The other EXOR circuits 445B-445Z operate in a similar manner.

The selection signal generator circuit 452 of FIG. 17 includes a computation circuit 458. The computation circuit 458 includes EXOR circuits 457A, 457B, . . . , and 457Z, and a determination circuit 459. The EXOR circuit 457A compares the detection signal DECO[0] with the adjacent detection signal DEC1[0] corresponding thereto, and outputs "0" if a match is found, and "1" if no match is found. The EXOR circuit 457A also compares the detection signal DECO[1]

with the detection signal DEC1[1], and outputs "0" if a match is found, and "1" if no match is found. In a similar manner, the other EXOR circuits 457B-457Z compare the detection signals DEC1-DECn−1 with the respective adjacent detection signals DEC2-DECn−1 and DEC0, and output the results.

Among the EXOR circuits 457A-457Z, an EXOR circuit which receives the detection signal DECi[0] having a value "1" indicates a boundary between a set of data signals having appropriate phases and a set of data signals having phases which are not appropriate. This rule also applies to the detection signal DECi[1]. The EXOR circuits 457A and 457Z are deemed to be provided next to each other.

With respect to the detection signal DECi[0], the determination circuit 459 determines a circuit which is provided farthest from the circuits each outputting "1" and thereby indicating a boundary, and which receives "0" (which means that the values of the data signal and of the known data are the same). In other words, the determination circuit 459 determines a circuit corresponding to a data signal which provides sufficient times between the transition of the clock CLKD and the changes in the value of the data signal both before and after the transition of the clock CLKD. The determination circuit 459 then generates and outputs the selection signal EN indicating the data signal and the clock corresponding to the determined circuit.

In this operation, assuming that the appropriate signals are data signals Dp-Dq, and that boundaries exist between the data signals Dp and Dp+1 and between the data signals Dq and Dq−1, the determination circuit 459 generates and outputs the selection signal EN indicating, for example, a data signal Dr (where r is the integer closest to (p+q)/2). The determination circuit 459 generates and outputs the selection signal EN also for the detection signal DECi[1] in a similar manner. The data recovery unit of FIG. 17 can also recover data while leaving sufficient timing margins.

According to the configuration shown in FIG. 17, the determination circuit 459 can determine the data signal having a value which matches the value of the known data, that is, the data signal representing a normal value among the input data signals. If there are no appropriate data signals representing a normal value, it can be determined that an error has occurred. If it is determined that an error has occurred during the initialization period, the determination circuit 459 may generate an error signal ER indicating an occurrence of an error, and store the error signal ER to the storage unit 36.

By using the data recovery unit of FIG. 17, for example, in the clock and data recovery circuits of FIGS. 10-12, and using the error signal ER read from the storage unit 36 instead of the clock control signal CC, the number of clocks included in each of the multiphase clocks may be increased during the data communication period if the error signal ER indicates an occurrence of an error. In addition, if the error signal ER indicates an occurrence of an error, the loop bandwidth of the PLL in the multiphase clock generator circuit may be changed to a smaller value, which will be described in detail later. The increase of the numbers of clocks and the reduction of the loop bandwidth of the PLL may be both provided. Thus, usage of the error signal ER can improve the recovery accuracy.

Figure 18:
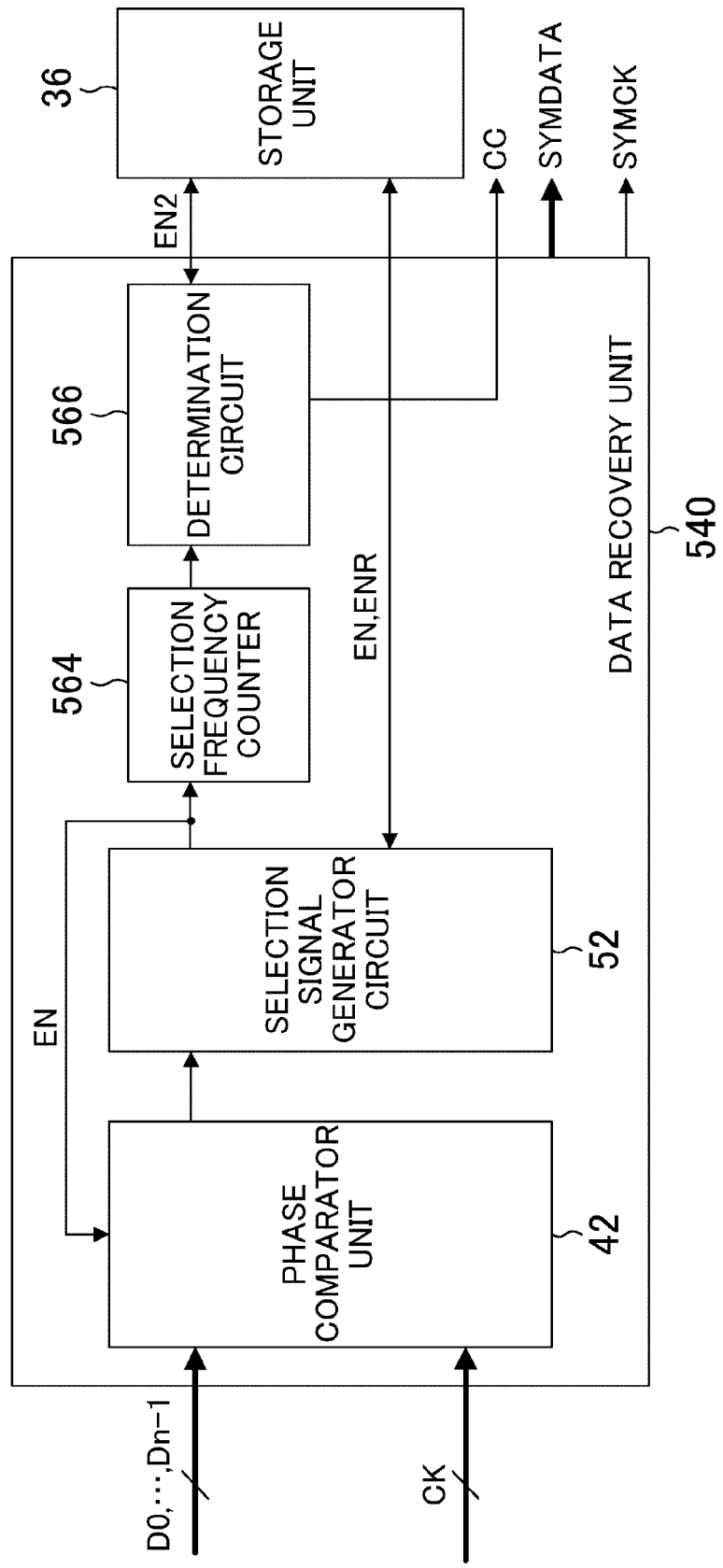
FIG. 18 is a block diagram illustrating a configuration of a third variation of the data recovery unit of FIG. 2.

FIG. 18 is a block diagram illustrating a configuration of a third variation of the data recovery unit 40 of FIG. 2. The data recovery unit 540 of FIG. 18 differs from the data recovery unit 40 in further including a selection frequency counter 564 and a determination circuit 566. The selection frequency counter 564 counts how many times each of the data signals Di is selected during the initialization period, using the selection signal EN, and outputs the selection frequencies of the respective data signals Di to the determination circuit 566.

FIG. 19A is an illustrative diagram of an example of selection frequencies of the respective data signals Di. FIG. 19B is an illustrative diagram of another example of selection frequencies of the respective data signals Di. In FIG. 19A, the data signals D5-D9 are selected three, four, five, four, and three times, respectively, and the other data signals are not selected during the initialization period.

The determination circuit 566 determines that the clocks corresponding to the data signals D5-D9 are required, and that the other clocks are not required, and thus stores, to the storage unit 36, a selection signal EN2 indicating that the clocks corresponding to the data signals D5-D9 should be output. In the data communication period, the determination circuit 566 reads the value of the selection signal EN2 stored in the storage unit 36, and outputs the read value to the clock selection circuits 38A-38C or to the multiphase clock generator circuit 210 as the clock control signal CC.

The supply of clocks is stopped, for example, as described referring to FIGS. 10-12. The clock selection circuits 38A-38C or the multiphase clock generator circuit 210 stops the supply of the clocks other than the clocks corresponding to the data signals D5-D9. Not only the clocks corresponding to the data signals D5-D9, but also clocks corresponding to data signals having phases close to those of the data signals D5-D9 may be output. For example, the clocks corresponding to the data signals D4 and D10 may be output, and further the clocks corresponding to the data signals D3 and D11 may also be output.

In FIG. 19B, the data signals D8, D6, D4, and D10 are selected nine, eight, two, and two times, respectively, and the other data signals are not selected during the initialization period. The determination circuit 566 determines that the clocks corresponding to the data signals D4, D6, D8, and D10 are required, and that the other clocks are not required, and thus stores, to the storage unit 36, a selection signal EN2 indicating that the clocks corresponding to the data signals D4, D6, D8, and D10 should be output. In the data communication period, the determination circuit 566 reads the value of the selection signal EN2 stored in the storage unit 36, and outputs the read value to the clock selection circuits 38A-38C or to the multiphase clock generator circuit 210 as the clock control signal CC.

The clock selection circuits 38A-38C or the multiphase clock generator circuit 210 stops the supply of the clocks other than the clocks corresponding to the data signals D4, D6, D8, and D10. The supply of clocks having phases between the phases of two clocks which are not stopped may be exempted from being stopped. That is, in FIG. 19B, the clocks corresponding to the data signals D5, D7, and D9 are exempted from being stopped, and thus the clocks D4-D10 may be output.

FIG. 20 is a block diagram illustrating a configuration of a fourth variation of the data recovery unit 40 of FIG. 2. The data recovery unit 640 of FIG. 20 differs from the data recovery unit 40 in further including a selection frequency counter 564, a tracking circuit 665, and a determination circuit 666.

Figure 21:
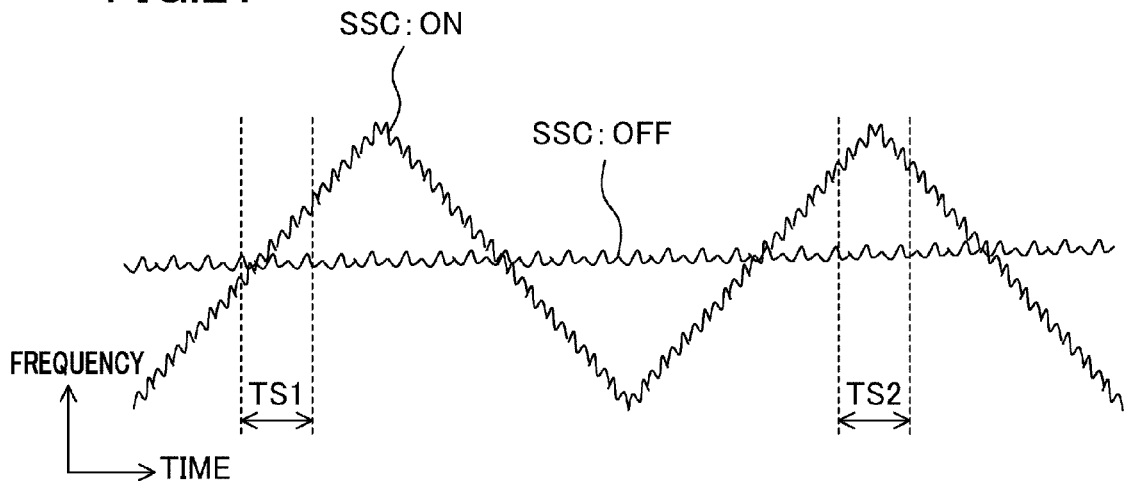
FIG. 21 is a graph illustrating an example of the frequency change of a received data signal.

FIG. 21 is a graph illustrating an example of the frequency change of a received data signal. In order to reduce electromagnetic radiation, for example, the serial ATA standard uses spread spectrum clocking (SSC). Thus, as shown in FIG. 21, if SSC is active, the frequency of the received data signal (RX+ and RX−) repeats a change by a constant amount with a constant period. If SSC is not active, the frequency of the received data signal is nearly constant.

Figure 22A:
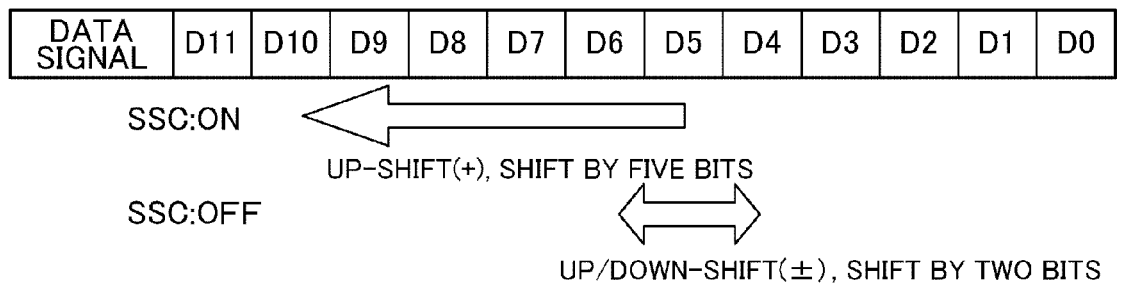
FIG. 22A is an illustrative diagram of an example of a tracking result obtained by the tracking circuit of FIG. 20.
Figure 22B:
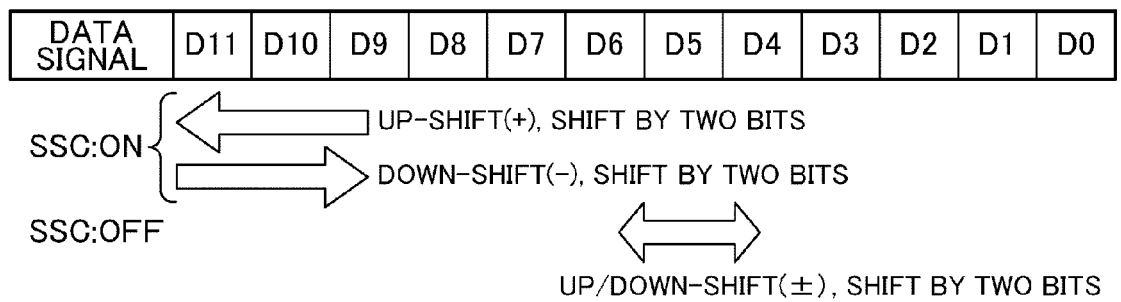
FIG. 22B is an illustrative diagram of another example of a tracking result obtained by the tracking circuit of FIG. 20.

FIG. 22A is an illustrative diagram of an example of a tracking result obtained by the tracking circuit 665 of FIG. 20. FIG. 22B is an illustrative diagram of another example of a tracking result obtained by the tracking circuit 665 of FIG. 20. A tracking result in the period TS1 of FIG. 21 is illustrated in FIG. 22A. The data in the shift register 56 of the selection signal generator circuit 52 is up shifted five times, and the shift amount is five bits.

In addition, a tracking result in the period TS2 of FIG. 21 is illustrated in FIG. 22B.

The tracking circuit 665 tracks the result of clock selection performed using the selection signal EN in the initialization period. More specifically, the tracking circuit 665 determines the number of bits by which the bits each having a value "1" in the selection signal EN are shifted, how many times the data is up shifted (left shifted in FIG. 22A), and how many times the data is down shifted (right shifted in FIG. 22A) during a predetermined period in the initialization period, and then outputs the results to the determination circuit 666.

For example, if the data is up shifted by five bits as shown in FIG. 22A, then the determination circuit 666 determines that clocks are required which correspond to data signals corresponding to both the center of the range (D5-D10) determined by the tracking and a predetermined range across the center, and that the other clocks are not required, and thus stores, to the storage unit 36, a selection signal EN2 indicating that the clocks considered necessary should be output. In the data communication period, the determination circuit 666 reads the value of the selection signal EN2 stored in the storage unit 36, and outputs the read value to the clock selection circuits 38A-38C or to the multiphase clock generator circuit 210 as the clock control signal CC.

The determination circuit 666 may determine the required clocks based on the selection frequencies of the respective data signals Di determined by the selection frequency counter 564. For example, the determination circuit 666 may determine that both the clocks considered necessary based on the tracking result obtained by the tracking circuit 665 and the clocks considered necessary based on the selection frequencies of the respective data signals Di determined by the selection frequency counter 564 are required.

The determination circuit 666 may determine whether SSC is active or not (i.e., whether the received data signal is frequency modulated or not) based on the tracking result. If SSC is not active, the frequency of the received data signal varies only by the effect of jitter, and thus the number of clocks to be selected is small, and the bits of the selection signal EN indicating the clocks to be selected (i.e., the bits each having a value of "1") repeats up-shifts and down-shifts.

If SSC is active, the frequency of the received data signal varies as defined in the interface specification, and thus the number of clocks to be selected is relatively large. Note that although the bits of the selection signal EN indicating the clocks to be selected may frequently change the moving direction thereof during the tracking period, the average of the moving directions from the beginning to the end of tracking is detected as a movement in one direction, or the average of the moving directions from the beginning to a certain time point of tracking is detected as a movement in one direction, and the average thereafter is detected as a movement in the other direction.

The determination circuit 666 determines whether the tracking result is closer to the movement when SSC is not active or to the movement when SSC is active, and stores the determination result to the storage unit 36 as the selection signal EN2. In the data communication period, the determination circuit 666 reads the value of the selection signal EN2 stored in the storage unit 36, and outputs the read value as a determination signal SC.

For example, the SSC defined in the serial ATA standard uses a modulation frequency of 30-33 kHz (i.e., the period of modulation is 30.3-33.33 μs). Since the half period thereof is about 15 μs, the period of COMWAKE (for a transmission speed of 1.5 Gbps, 160·1 UI (666.66 ps)+160·1 UI (666.66 ps)=0.2 μs) is equivalent to about one seventh of the half period of the SSC, and thus tracking only during the COMWAKE period allows it to be determined whether SSC is active or not. The criteria of determining whether SSC is active or not may be determined based on the interface specification or based on an evaluation result on engineering samples.

Figure 23:
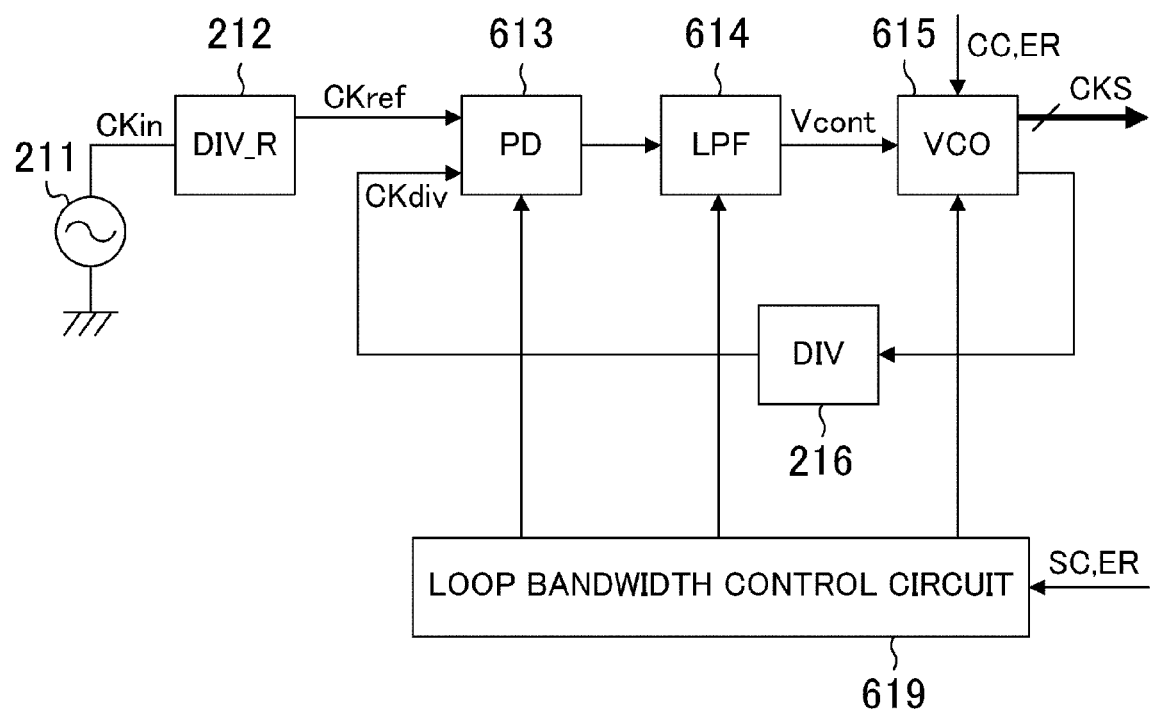
FIG. 23 is a block diagram illustrating a configuration of a variation of the multiphase clock generator circuit of FIG. 13.

FIG. 23 is a block diagram illustrating a configuration of a variation of the multiphase clock generator circuit 210 of FIG. 13. The multiphase clock generator circuit of FIG. 23 includes an oscillator 211, frequency dividers 212 and 216, a phase comparator 613, a low-pass filter 614, a VCO 615, and a loop bandwidth control circuit 619. Although not shown in FIG. 23, the multiphase clock generator circuit of FIG. 23 divides the frequency of the multiphase clock CKS, thereby generates a multiphase clock CK.

The loop bandwidth ω of the PLL including the phase comparator 613, the low-pass filter 614, the VCO 615, and the frequency divider 216, the frequency division ratio N of the frequency divider 216, the gain Kpd of the phase comparator 613, the transfer function F of the low-pass filter 614, and the gain Kvco of the VCO 615 generally satisfy the following equation:

$$\omega \propto Kpd \cdot F \cdot Kvco \cdot (1/N)$$

The loop bandwidth control circuit 619 controls the loop bandwidth of the PLL based on the determination signal SC indicating whether SSC is active or not. More specifically, if the determination signal SC indicates that SSC is not active, the loop bandwidth control circuit 619 changes, before the beginning of data communication, at least one of the gain Kpd of the phase comparator 613, the transfer function F of the low-pass filter 614, or the gain Kvco of the VCO 615 to a smaller value than that of when the determination signal SC indicates that SSC is active, so that the loop bandwidth is reduced. This reduces jitter, thereby improving the accuracy in the clock and data recovery operation.

A tracking result which indicates that the selection of the clocks to be selected significantly varies may not only be caused by a poor jitter characteristic of the received data signal etc., but also be caused by a poor jitter characteristic of the PLL in the multiphase clock generator circuit which generates the multiphase clocks. Accordingly, the determination circuit 666 of FIG. 20 may detect jitter based on the tracking result, and generate a determination signal SC indicating whether or not the amount of jitter is greater than or equal to a predetermined threshold.

If the determination signal SC indicates that the amount of jitter is greater than or equal to the predetermined threshold, the loop bandwidth control circuit 619 provide control so as to change, before the beginning of data communication, at least one of the gain Kpd of the phase comparator 613, the transfer function F of the low-pass filter 614, or the gain Kvco of the VCO 615 to a smaller value than that which will otherwise be. This reduces jitter, thereby improving the accuracy in the clock and data recovery operation.

The loop bandwidth control circuit 619 of the multiphase clock generator circuit of FIG. 23 may provide control based on the error signal ER output from the determination circuit 459 of FIG. 17. More specifically, if there are no appropriate data signals, and thus the error signal ER indicates an occurrence of an error, the loop bandwidth control circuit 619 provide control so as to change, before the beginning of data communication, at least one of the gain Kpd of the phase comparator 613, the transfer function F of the low-pass filter 614, or the gain Kvco of the VCO 615 to a smaller value than that when the error signal ER indicates that an appropriate data signal exists, so that the loop bandwidth is reduced. This reduces jitter, thereby allowing an appropriate data signal to be obtained. If the error signal ER indicates an occurrence of an error, the VCO 615 may generate more clocks during the data communication period as the VCO 215 of FIG. 13 does.

Figure 24:
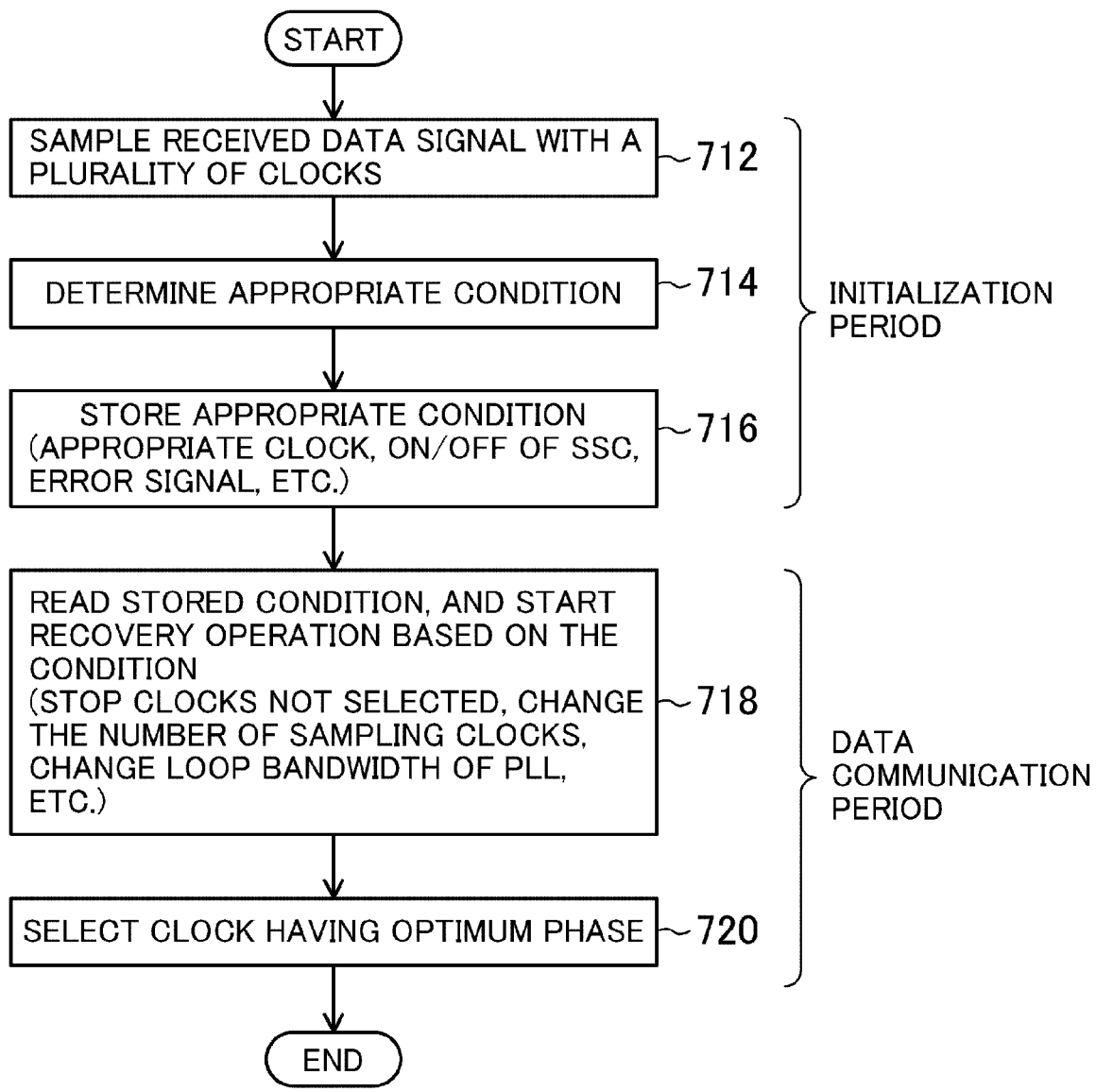
FIG. 24 is a flowchart illustrating an example of the process flow in the clock and data recovery circuit of FIG. 1 etc.

FIG. 24 is a flowchart illustrating an example of the process flow in the clock and data recovery circuit of FIG. 1 etc. The process flow will be described below considering all the aspects of the embodiment described above.

At 712, the sampling circuit 32 receives a differential data signal (RX+ and RX−), samples the differential data signal in synchronism with each of the n clocks included in the multiphase clock CKS, and outputs the sampled values to the serial-parallel conversion circuit 34 as data signals DS[n−1:0] respectively corresponding to the n clocks.

At 714, the data recovery unit 40 makes a determination of an appropriate condition for clock and data recovery. For example, the data recovery unit 40 performs a clock and data recovery operation, determines a data signal having an appropriate phase among the data signals D0-Dn−1, and generates a selection signal EN indicating this data signal. At 714, at least one of generation of such a selection signal EN, generation of a clock control signal CC by the storage unit 36 based on the selection signal EN, generation of an error signal ER by the determination circuit 459, generation of a selection signal EN2 by the determination circuit 566, generation of a determination signal SC by the determination circuit 666, etc. is performed as a determination process of an appropriate condition for clock and data recovery.

At 716, the storage unit 36 stores the determined appropriate condition. At 718, the data recovery unit 40 reads the stored condition from the storage unit 36, and starts a clock and data recovery operation based on the condition. During this operation, for example, the supply of clocks is stopped as described referring to FIGS. 10-12, the number of clocks is changed as described referring to FIGS. 13 and 14, or the loop bandwidth of the PLL is changed as described referring to FIG. 23.

At 720, the data recovery unit 40 selects at least one clock having an optimum phase based on the read condition. The operations 712, 714, and 716 are performed in the initialization period, and the operations 718 and 720 are performed in the subsequent data communication period. Such a process allows appropriate data signals and clocks to be output in a short time.

The clock and data recovery circuits described above may omit the serial-parallel conversion circuit 34. In this case, the data recovery unit 40 processes the data signals DS based on the multiphase clock CKS, and thus the multiphase clock CK having a divided frequency is no more required. Moreover, in this case, the clock selection circuit 38B is also not required, and the clock selection circuit 38C selects and outputs m clocks from the clocks CKS[0]-CKS[n−1] based on the clock control signal CC or the selection signal EN.

Although the above description assumes that a differential signal is input to the clock and data recovery circuit as a received data signal, a single-ended signal may be input instead.

As described above, according to the present invention, the time needed for clock and data recovery can be reduced, and thus the present invention is useful for clock and data recovery circuits etc.

The many features and advantages of the invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A clock and data recovery circuit, comprising:
a multiphase clock generator circuit configured to generate a multiphase clock having a plurality of clocks;
a sampling circuit configured to sample a received data signal transferring serial data in synchronism with each of the plurality of clocks, and to generate a plurality of data signals respectively representing values sampled in synchronism with the respective plurality of clocks;
a data recovery unit configured to generate a selection signal indicating a data signal having an appropriate phase among the plurality of data signals; and
a storage unit configured to store the selection signal,
wherein the data recovery unit generates the selection signal during at least a part of an initialization period for receiving a data signal and selects one of the plurality of data signals based on the selection signal read from the storage unit, selects from the plurality of clocks a clock corresponding to the selected data signal, and outputs the selected data signal and the selected clock, and
the data recovery unit reads the selection signal stored in the storage unit as an initial value, selects one of the plurality of data signals based on the initial value and starts the clock and data recovery operation by reading the initial value, and thereafter the data recovery unit performs data communication.

2. The clock and data recovery circuit of claim 1, further comprising:
a clock selection unit configured to make a selection from the plurality of clocks based on the selection signal, and to supply the selected clock or clocks to the sampling circuit and to the data recovery unit,
wherein at least one of the sampling circuit or the data recovery unit includes circuits which operate based on the respective plurality of clocks, and stops operations of circuits corresponding to clocks not supplied.

3. The clock and data recovery circuit of claim 1, wherein
the storage unit identifies both an initialization period and a data communication period for the received data signal, and outputs, as a control signal, a predetermined value in at least a part of the initialization period, and the selection signal read from the storage unit in a period during which the data recovery unit operates based on the selection signal read from the storage unit,
the multiphase clock generator circuit changes a number of the plurality of clocks included in the multiphase clock based on the control signal, and
at least one of the sampling circuit or the data recovery unit includes circuits which operate based on the respective plurality of clocks, and stops operations of circuits corresponding to clocks which are not supplied from the clock selection unit.

4. The clock and data recovery circuit of claim 3, wherein the multiphase clock generator circuit includes an inverter chain formed by a plurality of inverters connected in the form of a ring, outputs outputs of the plurality of inverters as the plurality of clocks, and changes a number of inverters included in the inverter chain by changing a connection pattern of the plurality of inverters based on the control signal.

5. The clock and data recovery circuit of claim 1, wherein the data recovery unit includes
a phase comparator unit configured to generate a detection signal indicating whether the data signal indicated by the selection signal, of the plurality of data signals, has an appropriate phase or not, and
a selection signal generator circuit configured to generate the selection signal based on the detection signal.

6. The clock and data recovery circuit of claim 1, further comprising:
a serial-parallel conversion circuit configured to generate and output a plurality of converted parallel data signals each transferring, at a time, a plurality of bits of data in parallel which have been transferred by a corresponding one of the plurality of data signals,
wherein the multiphase clock generator circuit divides frequencies of the plurality of clocks, and outputs frequency-divided clocks, and
the data recovery unit generates the selection signal based on pluralities of bits, transferred in parallel, of the converted parallel data signals, and selects from the frequency-divided clocks a clock corresponding to the selected data signal.

7. The clock and data recovery circuit of claim 1, wherein the data recovery unit includes
a phase comparator unit configured to generate a detection signal, for each of the plurality of data signals, indicating whether that data signal has an appropriate phase or not, and
a selection signal generator circuit configured to generate the selection signal based on the detection signals,
wherein the selection signal generator circuit includes a computation circuit configured to determine, based on the detection signals, a boundary between a set of data signals having appropriate phases and a set of data signals having phases which are not appropriate among the plurality of data signals.

8. The clock and data recovery circuit of claim 1, wherein the data recovery unit includes
a known data storage unit configured to store known data to be received during an initialization period,
a phase comparator unit configured to compare each of the plurality of data signals with the known data, and to generate a detection signal representing a comparison result, and
a selection signal generator circuit configured to generate the selection signal based on the detection signals.

9. The clock and data recovery circuit of claim 8, wherein the selection signal generator circuit includes a computation circuit configured to determine, based on the detection signals, a boundary between a set of data signals having appropriate phases and a set of data signals having phases which are not appropriate among the plurality of data signals.

10. The clock and data recovery circuit of claim 1, wherein the data recovery unit includes a determination circuit configured to determine, based on the selection signal, whether the received data signal is frequency modulated or not.

11. The clock and data recovery circuit of claim 10, wherein
the multiphase clock generator circuit includes a phase-locked loop (PLL), and if the received data signal is not frequency modulated, the multiphase clock generator circuit changes a loop bandwidth of the PLL to a smaller value than that of when the received data signal is frequency modulated.

12. The clock and data recovery circuit of claim 1, wherein the data recovery unit outputs an error signal if there are no data signals having appropriate phases.

13. The clock and data recovery circuit of claim 12, wherein
the multiphase clock generator circuit includes a PLL, and if the error signal is output, the multiphase clock generator circuit provides at least one of an increase of a number of the plurality of clocks included in the multiphase clock, or a reduction of a loop bandwidth of the PLL.

14. The clock and data recovery circuit of claim 1, wherein
the data recovery unit determines an appropriate condition for clock and data recovery in an initialization period,
the storage unit stores the condition, and
the data recovery unit operates based on the condition read from the storage unit in a data communication period after the initialization period.

15. The clock and data recovery circuit of claim 1, wherein the storage unit identifies both the initialization period and a data communication period.

16. A clock and data recovery circuit, comprising:
a multiphase clock generator circuit configured to generate a multiphase clock having a plurality of clocks;
a sampling circuit configured to sample a received data signal transferring serial data in synchronism with each of the plurality of clocks, and to generate a plurality of data signals respectively representing values sampled in synchronism with the respective plurality of clocks;
a data recovery unit configured to generate a selection signal indicating a data signal having an appropriate phase among the plurality of data signals; and
a storage unit configured to store the selection signal,
wherein the data recovery unit selects one of the plurality of data signals based on the selection signal read from the storage unit, selects from the plurality of clocks a clock corresponding to the selected data signal, and outputs the selected data signal and the selected clock,
the storage unit identifies both an initialization period and a data communication period for the received data signal, and outputs, as a control signal, a predetermined value in at least a part of the initialization period, and the selection signal read from the storage unit in a period during which the data recovery unit operates based on the selection signal read from the storage unit, and
a clock selection unit makes a selection based on the control signal.

* * * * *